(12) United States Patent  
Nowak et al.

(10) Patent No.: US 7,903,715 B2  
(45) Date of Patent: Mar. 8, 2011

(54) SLAB TYPE LASER APPARATUS

(75) Inventors: Krzysztof Nowak, Hiratsuka (JP); Takashi Suganuma, Hiratsuka (JP); Osamu Wakabayashi, Hiratsuka (JP); Akira Endo, Hiratsuka (JP)

(73) Assignee: Gigaphoton Inc., Tokyo (JP)

( * ) Notice: Subject to any disclaimer, the term of this patent is extended or adjusted under 35 U.S.C. 154(b) by 15 days.

(21) Appl. No.: 12/482,824

(22) Filed: Jun. 11, 2009

(65) Prior Publication Data

US 2009/0316746 A1 Dec. 24, 2009

(30) Foreign Application Priority Data

Jun. 12, 2008 (JP) .................. 2008-154264  
Feb. 10, 2009 (JP) .................. 2009-029011

(51) Int. Cl.  
*H01S 3/22* (2006.01)

(52) U.S. Cl. ............ 372/55; 372/50.22; 372/57; 372/69; 372/87; 372/92; 372/106

(58) Field of Classification Search ............... 372/50.22, 372/55, 57, 69, 87, 106  
See application file for complete search history.

(56) References Cited

U.S. PATENT DOCUMENTS

| 7,317,196 B2 * | 1/2008 | Partlo et al. ............... 250/504 R |
| 2004/0179571 A1 * | 9/2004 | Govorkov et al. ............... 372/55 |
| 2007/0115535 A1 * | 5/2007 | Govorkov et al. ............ 359/333 |

FOREIGN PATENT DOCUMENTS

JP 2009-26854 2/2009

OTHER PUBLICATIONS

Tatsuya Ariga et al., "*Extreme Ultraviolet Rays (EUV) Lithography Light Source $CO_2$ Laser*", O plus E, New Technology Communications, vol. 28, No. 12, Dec. 2004, pp. 1263-1267.

\* cited by examiner

*Primary Examiner* — Dung T Nguyen  
(74) *Attorney, Agent, or Firm* — Wenderoth, Lind & Ponack, L.L.P.

(57) ABSTRACT

A slab type laser apparatus has a slab type gas laser medium part formed in a region defined by a pair of electrode flat plates oppositely disposed in parallel with each other in a space to be filled with a gas laser medium which is excited by high-frequency electric power. The apparatus includes an oscillator part including a pair of resonator mirrors oppositely disposed with a part of the gas laser medium part in between, and for amplifying a laser beam to have predetermined light intensity to emit the laser beam, and the amplifier part including a plurality of return mirrors oppositely disposed with a part of the gas laser medium part in between. The incident laser beam goes and returns plural times between the return mirrors, and the laser beam is amplified to have predetermined power.

11 Claims, 17 Drawing Sheets

$F = L = R/2$

INCIDENT BEAM POSITION (FIRST FIXED POINT) 34

35 INCIDENT BEAM TRANSFER POSITION (SECOND FIXED POINT)

34 INCIDENT BEAM POSITION (FIRST FIXED POINT)

INCIDENT BEAM TRANSFER POSITION (SECOND FIXED POINT)

INCIDENT BEAM POSITION (FIRST FIXED POINT) 34
10 OSCILLATOR PART
30 AMPLIFICATION REGION
35 INCIDENT BEAM TRANSFER POSITION (SECOND FIXED POINT)
20 AMPLIFIER PART

AMPLIFIER PART
REGENERATIVE AMPLIFIER PART
MULTI-LINE SEEDER 60

OSCILLATION/AMPLIFICATION-TYPE LASER

SLAB TYPE LASER APPARATUS

CROSS-REFERENCE TO RELATED APPLICATIONS

The present application claims priority from Japanese Patent Applications No. 2008-154264 filed on Jun. 12, 2008 and No. 2009-029011 filed on Feb. 10, 2009, the content of which are herein incorporated by reference in their entirety.

BACKGROUND OF THE INVENTION

1. Field of the Invention

The present invention relates to a slab type laser apparatus for emitting a pulse laser beam, and particularly to a slab type carbon dioxide gas ($CO_2$) laser apparatus for emitting a driver laser beam to be applied to a target material to turn the target material into plasma for radiating extreme ultraviolet (EUV) light in an extreme ultraviolet light source apparatus.

2. Description of a Related Art

Recent years, as semiconductor processes become finer, photolithography has been making rapid progress to finer fabrication. In the next generation, micro-fabrication at 60 nm to 45 nm, further, micro-fabrication at 32 nm and beyond will be required. Accordingly, in order to fulfill the requirement for micro-fabrication at 32 nm and beyond, for example, exposure equipment is expected to be developed by combining an extreme ultraviolet (EUV) light source generating EUV light having a wavelength of about 13 nm and reduced projection reflective optics.

Recently, an immersion method using an ArF laser enables even a micro-fabrication at 45 nm, and a micro-fabrication at 32 nm to 22 nm and beyond using the EUV light is going to be carried out in EUV lithography.

As the EUV light source, there are three kinds of light sources, which include an LPP (laser produced plasma) light source using plasma generated by applying a laser beam to a target, a DPP (discharge produced plasma) light source using plasma generated by discharge, and an SR (synchrotron radiation) light source using orbital radiation. Among them, the LPP light source has advantages that extremely high intensity close to black body radiation can be obtained because plasma density can be made considerably larger, that the light emission of only the necessary waveband can be performed by selecting the target material, and that an extremely large collection solid angle of $2\pi$ steradian to $4\pi$ steradian can be ensured because it is a point light source having substantially isotropic angle distribution and there is no structural member surrounding the light source such as electrodes. Therefore, the LPP light source is considered to be predominant as a light source for EUV lithography, which requires power of 100 W or more.

FIG. 31 shows a system configuration of an LPP type EUV light source.

An EUV light source generates plasma by focusing a driver laser beam onto a target material, such as tin (Sn), that is present in a vacuum chamber. A variety of wavelength components containing extreme ultraviolet (EUV) light are radiated from the generated plasma, and the desired EUV component among the variety of wavelength components is selectively reflected and collected by using a collector mirror (EUV collector mirror), and outputted to a device, such as an exposure unit, using the EUV light.

The EUV light source is required to have output power exceeding 100 W. For example, a carbon dioxide gas ($CO_2$) laser beam generates EUV light with comparatively high efficiency, by being applied to tin (Sn) to generate plasma. Even a $CO_2$ laser apparatus, which emits a driver laser beam for plasma generation, requires higher efficiency and space-saving for industrial applications.

FIG. 32 is a schematic diagram showing configuration of a master oscillator power amplifier type laser apparatus to be used as a driver laser.

A pulse laser is used for plasma generation. A master oscillator power amplifier type laser apparatus as shown in FIG. 32 includes a laser oscillator which is a short-pulse $CO_2$ laser generator, and a laser amplifier for amplifying a short-pulse $CO_2$ laser beam. The laser amplifier includes a discharge device for exciting a $CO_2$ laser gas containing carbon dioxide ($CO_2$), nitrogen ($N_2$), helium (He), further according to need, hydrogen ($H_2$), carbon monoxide (CO), xenon (Xe) and so on by discharge.

A laser beam (seed laser beam) having energy "A" emitted from the laser oscillator is amplified to be a laser beam having desired energy "B" in the laser amplifier. The laser beam having the energy "B" is focused through a laser beam propagation system or a lens, and is applied to an EUV light generation target material that is selected from tin (Sn), xenon (Xe) and so on.

The inventors of this application already proposed a driver laser for an extreme ultraviolet light source apparatus in Japanese Unexamined Patent Application Publication JP-P2009-26854A. The driver laser employs, as a laser amplifier for amplifying laser energy "A" to laser energy "B", a slab type laser amplifier including an optical system having a plurality of mirrors for multi-path-reflecting a laser beam incident from a first window to propagate it in a discharge region and outputting it from a second window.

According to the proposed driver laser apparatus, since such a multi-path method is adopted such that an incident laser beam goes and returns plural times in a laser medium, it is possible to downsize a driver laser and amplify a laser beam efficiently.

However, the master oscillator power amplifier type laser apparatus having the above-mentioned configuration has an issue that a large installation area is required because the laser apparatus includes at least two laser modules such as an oscillator and an amplifier.

As a related technology, a fast axial flow $CO_2$ laser amplifier is disclosed in an article, i.e. Tatsuya Ariga and Akira Endo "$CO_2$ Laser for Extreme Ultraviolet (EUV) Rays Lithography Light Source", O plus E, New Technology Communications, Volume 28, No. 12 (December 2004), pp. 1263-1267.

SUMMARY OF THE INVENTION

The present invention has been achieved in view of the above-mentioned situations, and has a purpose to provide a laser apparatus with a higher efficiency and a reduced installation area for a slab type laser apparatus for emitting a pulse laser beam, particularly for a slab type carbon dioxide gas ($CO_2$) laser apparatus for emitting a driver laser beam to be applied to a target material to turn the target material into plasma for radiating extreme ultraviolet (EUV) light in an extreme ultraviolet light source apparatus.

To accomplish the above-mentioned purpose, a slab type laser apparatus according to one aspect of the present invention includes a slab type gas laser medium part formed in a region defined by a pair of electrode flat plates oppositely disposed in parallel with each other in a space to be filled with a gas laser medium, the gas laser medium being excited when high-frequency electric power is applied to the pair of electrode flat plates in the space filled with the gas laser medium, and the apparatus comprises: an oscillator part including a pair of resonator mirrors oppositely disposed with a part of the slab type gas laser medium part in between, and a coupling unit, wherein the oscillator part amplifies a laser beam oscillated in the oscillator part to have predetermined light intensity, and thereafter drives the coupling unit to emit the laser beam; and an amplifier part including an incidence mirror for deflecting the laser beam emitted from the oscillator part, and a plurality of return mirrors oppositely disposed with a part of the slab type gas laser medium part in between, wherein the amplifier part is configured such that a laser beam goes and returns plural times between the plurality of return mirrors, and the amplifier part receives the laser beam emitted from the oscillator part, and amplifies the laser beam to an amplified laser beam having predetermined power to output the amplified laser beam.

According to the present invention, since a driver laser is formed by using a slab type laser amplifier part as mentioned above, it is possible to downsize the driver laser, to amplify a laser beam efficiently, and to obtain a laser beam having a superior focusing performance by suppressing expansion of the beam.

Consequently, it is possible to obtain a space saving and efficient EUV generator by utilizing the laser apparatus according to the present invention as a driver laser of an extreme ultraviolet light source apparatus.

In addition, the slab type laser apparatus of the invention is compact and has high amplification efficiency, because light from a multi-line seeder is amplified by a regenerative amplifier in the slab type laser apparatus, and thereafter, further amplified by a multi-path amplifier in the same slab type laser apparatus.

DESCRIPTION OF THE PREFERRED EMBODIMENTS

Figure 1:
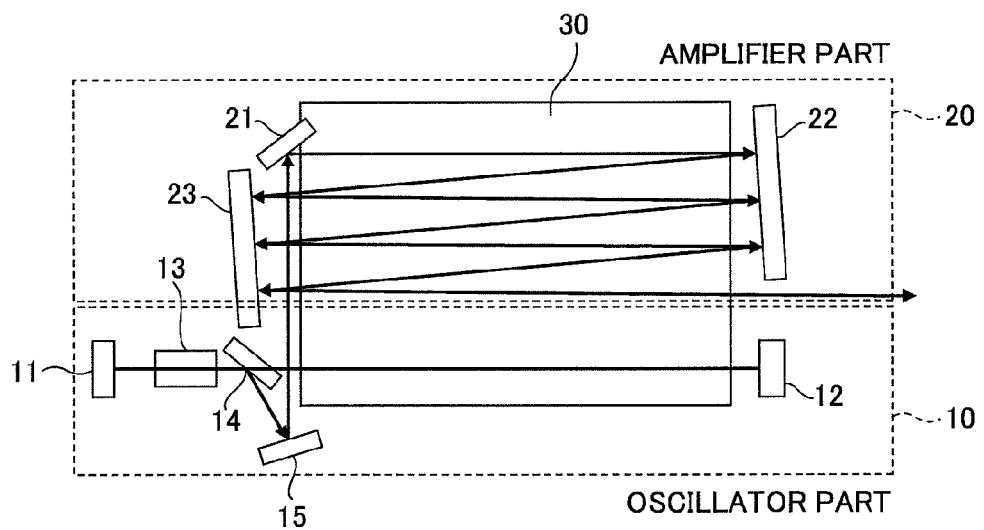
FIG. 1 is a schematic diagram showing a configuration of a slab type laser apparatus of a first example according to a first embodiment of the present invention.

Hereinafter, preferred embodiments according to the present invention will be described in detail referring to the drawings. In the drawings, the same reference numerals are assigned to the same component elements and the description thereof will be omitted.

Embodiment 1

FIG. 1 is a schematic diagram showing a configuration of a slab type laser apparatus of a first example according to a first embodiment of the present invention.

A slab type laser apparatus according to this embodiment is a $CO_2$ laser apparatus for supplying a laser beam to be applied to a target material to turn the target material into plasma in an extreme ultraviolet light source apparatus for supplying extreme ultraviolet (EUV) light to an exposure unit.

The slab type laser apparatus has a configuration in which an oscillator part 10 and an amplifier part 20 are integrated together with one body of a slab type $CO_2$ laser medium part 30.

The $CO_2$ laser medium part 30 forms a discharge field of slab type between a pair of electrodes in a region, in which the electrodes connected to a high-frequency power source (not shown) are disposed in opposition, by applying a high-frequency voltage to the electrodes to excite a $CO_2$ laser medium containing a carbon dioxide gas ($CO_2$) sandwiched between the electrodes.

The oscillator part 10 includes a part of the $CO_2$ laser medium part 30, and is provided with a pair of resonator mirrors 11 and 12, an electro-optic (EO) Pockels cell 13, a polarizer 14, and a coupling mirror 15.

The oscillator part 10 generates a short pulse $CO_2$ laser beam having a pulse width of about 10 ns by using the EO Pockels cell 13 forming a Q switch for switching a polarization direction at high speed. Incidentally, when a laser beam having pulse width of about 100 ns is required, an acousto-optic element (AO element) can be selected instead of the EO Pockels cell 13.

The polarizer 14 is an optical element for reflecting S-polarized light and for transmitting P-polarized light. And, the EO Pockels cell 13 is an optical element in which polarization is rotated only when a high voltage is applied thereto.

Since polarization is not changed when no voltage is applied to the EO Pockels cell 13, a P-polarized laser beam generated by the oscillator part 10 goes and returns multiple times between the resonator mirror 11 and the resonator mirror 12, and the laser beam can be amplified by transferring energy of the laser medium to the laser beam. That is, a transmission of the laser beam through the laser medium generates a stimulated emission, and the stimulated emission amplifies the laser beam.

A $CO_2$ laser beam generated by the oscillator part 10 becomes S-polarized light while the laser beam goes and returns through the EO Pockels cell 13 that is applied with a voltage corresponding to $\lambda/4$ wavelength, and the laser beam is reflected by the polarizer 14, incident upon the coupling mirror 15, reflected by the coupling mirror 15, and inputted to the amplifier part 20.

A mechanism for outputting light resonated in a resonator to the outside of the resonator at a desired timing as described above, or a mechanism for introducing light into the resonator is referred to as a coupling unit.

The amplifier part 20 includes a part of the $CO_2$ laser medium part 30, and is provided with an incidence mirror 21, and a return mirror 22 and a return mirror 23 opposite to each other.

The return mirror 22 and the return mirror 23 are plane mirrors, and disposed oppositely in parallel with each other putting the $CO_2$ laser medium part 30 therebetween. The $CO_2$ laser beam inputted from the oscillator part 10 is deflected by the incidence mirror 21, enters between the return mirror 22 and the return mirror 23, which are disposed in parallel with and opposite to each other, and shifts its reflection position while being multi-path-reflected between the return mirror 22 and the return mirror 23, and finally, goes out from an edge of the return mirror 22 and is supplied to an EUV light generation chamber or another $CO_2$ laser amplifier through an output window of the slab type laser apparatus.

The $CO_2$ laser beam is amplified in output power while the laser beam goes and returns through the excited $CO_2$ laser medium, and becomes a high-power laser beam.

As compared to a conventional slab type laser apparatus in which a resonator and an amplifier are connected in series, the slab type laser apparatus according to this embodiment is formed with the laser oscillator part 10 sharing the $CO_2$ laser medium with the amplifier part 20, and therefore, conventional two components are integrated into one body, resulting in simplification and downsizing of the configuration of the apparatus. In addition, the oscillator part 10 operates in the same $CO_2$ laser medium as the amplifier part 20 does, and the laser beam forms a multi-path route in the amplifier part 20 and can receive sufficient energy from the amplifier part 20. Accordingly, a high-power $CO_2$ laser beam can be obtained, and the efficiency of oscillation of the $CO_2$ laser beam is improved. That is, due to that the oscillator part 10 operates in the same $CO_2$ laser medium as the amplifier part 20 does, and that the laser beam is multi-path-amplified at the amplifier part 20, the efficiency of amplification becomes high and a high-power $CO_2$ laser can be obtained, as well as a compact slab type laser apparatus can be realized.

As mentioned above, the slab type laser apparatus according to this embodiment is a short-pulse $CO_2$ laser apparatus realizing space saving and high-power. Further, with the pulse width longer, the laser apparatus becomes more high-powered and efficient.

FIGS. 2-5 are schematic diagrams showing other examples according to this embodiment.

Figure 2:
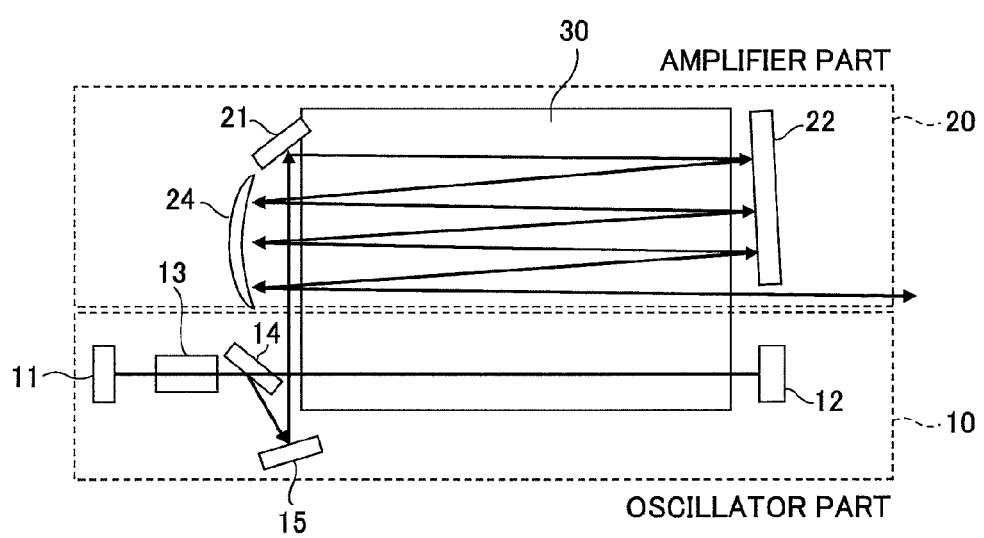
FIG. 2 is a schematic diagram showing a configuration of a slab type laser apparatus of a second example according to the first embodiment of the present invention.
Figure 3:
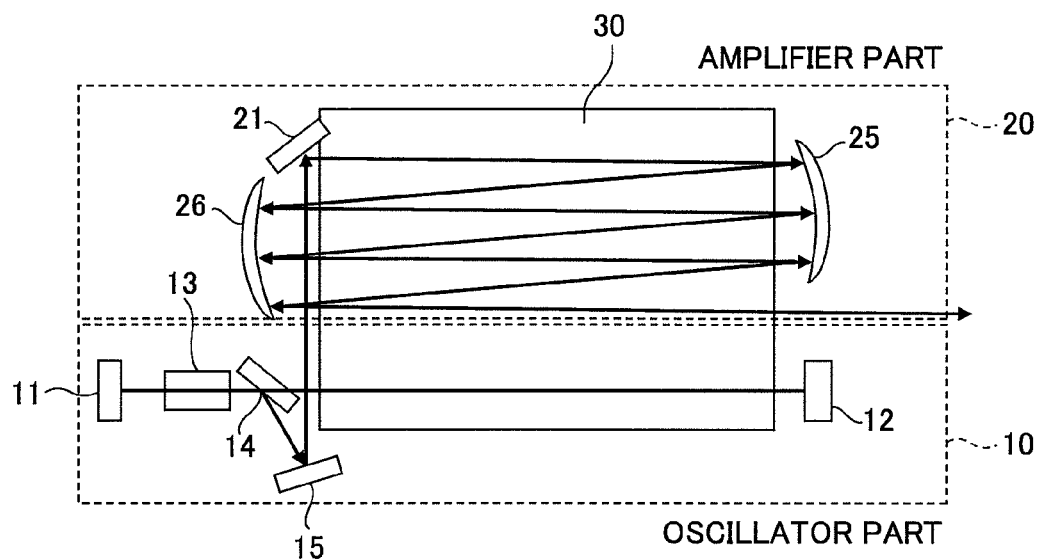
FIG. 3 is a schematic diagram showing a configuration of a slab type laser apparatus of a third example according to the first embodiment of the present invention.

Although both the return mirror 22 and the return mirror 23 opposite to each other in the amplifier part 20 are plane mirrors in the example as shown in FIG. 1, it is also possible that one mirror is a concave mirror 24 as shown in FIG. 2, or that both mirrors 25 and 26 are concave mirrors as shown in FIG. 3. Further, it is possible that one mirror is a concave mirror and the other is a convex mirror so that a discharge part having a large cross sectional area can be effectively utilized as in an unstable resonator.

Figure 4:
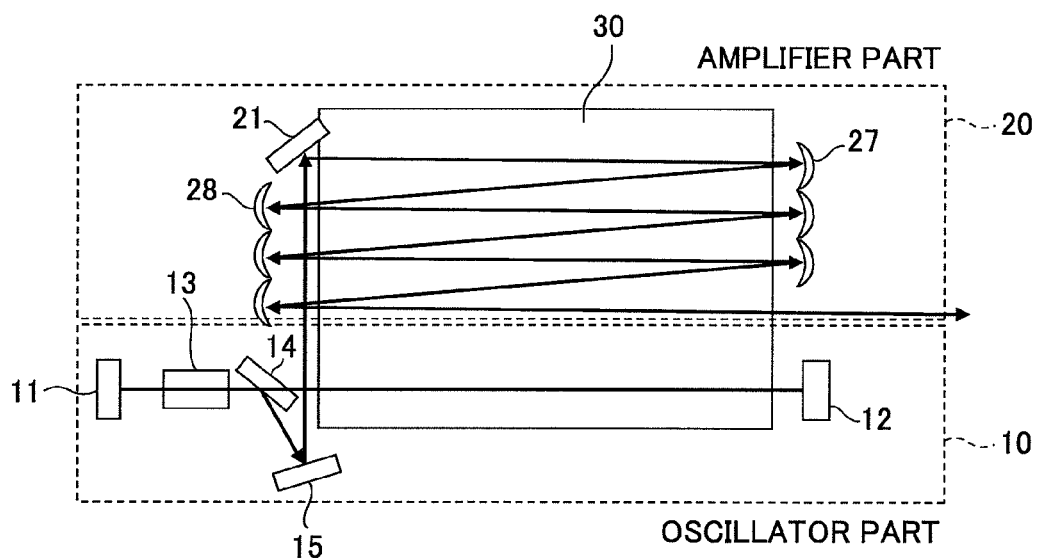
FIG. 4 is a schematic diagram showing a configuration of a slab type laser apparatus of a fourth example according to the first embodiment of the present invention.

In addition, as shown in FIG. 4, it is preferable that a pair of reflecting mirrors 27 and 28 are disposed oppositely in each of going and returning optical paths. Although these reflecting mirrors can be disposed individually, the return mirrors 27 and the return mirrors 28 opposite to each other may be formed to be respective integral units. When using the return mirrors that are formed integrally, it is easy to make alignment.

Figure 5:
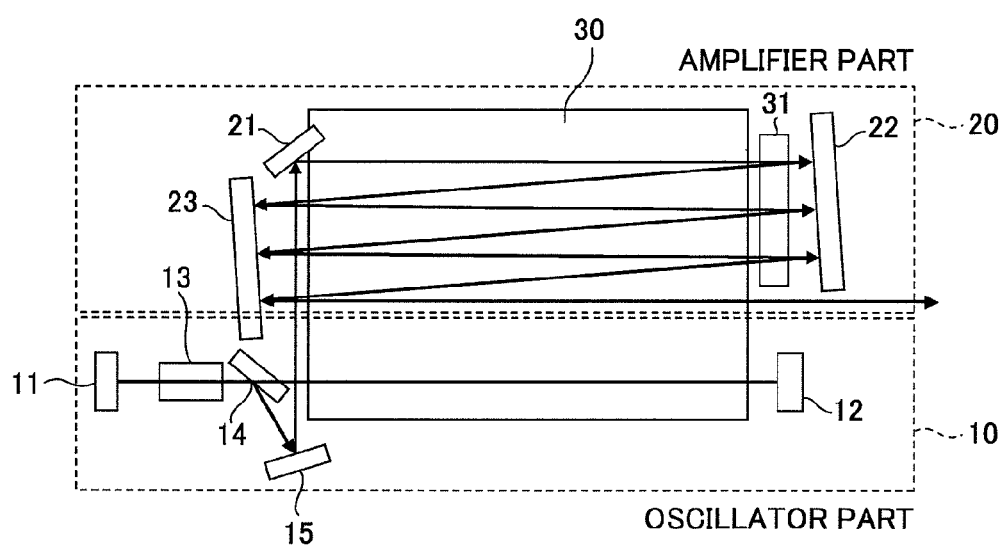
FIG. 5 is a schematic diagram showing a configuration of a slab type laser apparatus of a fifth example according to the first embodiment of the present invention.

FIG. 5 is a schematic diagram showing an example in which a saturable absorber 31 such as sulfur hexafluoride ($SF_6$) is interposed in a going and returning optical path of the amplifier part 20. A parasitic oscillation generated in the amplifier part 20 can be suppressed by using the saturable absorber.

Here, the amplifier part 20 includes the return mirror 22 and the return mirror 23 opposite to each other, and is configured as a multi-path amplifier provided with an optical system in which an incident laser beam passes at least twice through the slab type gas laser medium part 30 and is amplified, and functions to enable the laser beam outputted from the oscillation part 10 to enter the amplifier, to amplify it to a laser beam having predetermined power, and to output the amplified laser beam.

Embodiment 2

FIGS. 6-18 are drawings showing a slab type laser apparatus according to a second embodiment of the present invention. The slab type laser apparatus according to this embodiment is applied with an amplifier part having a stabilized optical axis by improving the optical system (return mirror optics) compared with the slab type laser apparatus according to the first embodiment, and has substantially the same configuration other than the amplifier part.

FIRST EXAMPLE

Figure 6:
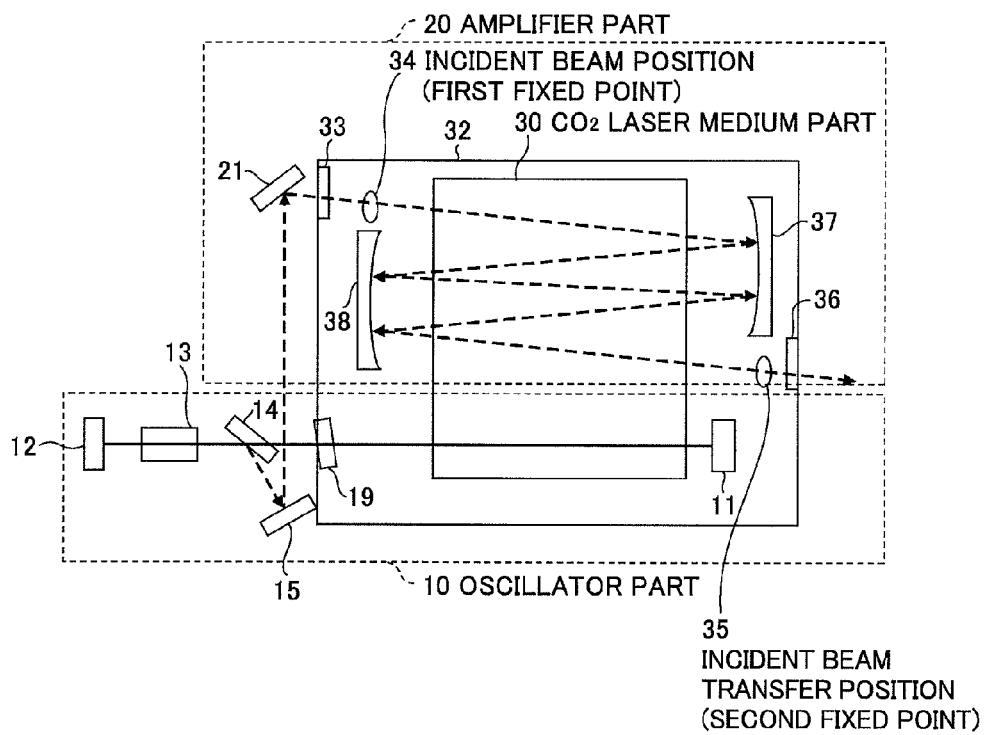
FIG. 6 is a schematic diagram showing a configuration of a slab type laser apparatus of a first example according to a second embodiment of the present invention.
Figure 7:
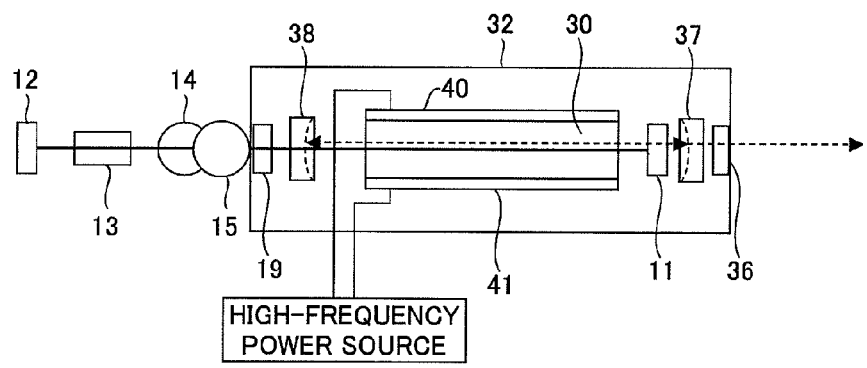
FIG. 7 is a side view showing a configuration of a slab type laser apparatus of the first example according to the second embodiment of the present invention.

FIGS. 6 and 7 show a slab type laser apparatus of a first example according to the second embodiment. FIG. 6 is a schematic diagram showing a configuration concept of the slab type laser apparatus of the first example, and FIG. 7 is a side view showing a cross section of a part of the slab type laser apparatus of the first example.

As shown in FIGS. 6 and 7, the slab type laser apparatus of this example has the configuration in which the oscillator part 10 and the amplifier part 20 are integrated together with one body of the slab type $CO_2$ laser medium part 30. The slab type $CO_2$ laser medium part 30 forms a discharge field of slab type between a pair of flat-plate electrodes 40 and 41 in a region, in which the electrodes connected to a high-frequency power source are disposed in opposition, by applying a high-frequency voltage from the high-frequency power source to the electrodes to excite a $CO_2$ laser medium containing a carbon dioxide gas ($CO_2$) sandwiched between the electrodes. The gap between the electrodes is about 0.5 mm to 5 mm, and the discharge cross section has a shape of thin rectangle.

The oscillator part 10 includes a part of the $CO_2$ laser medium part 30, and is provided with a pair of resonator mirrors 11 and 12, an electro-optic (EO) Pockels cell 13, a polarizer 14 and a coupling mirror 15. The oscillator part 10 includes the EO Pockels cell 13 forming a Q switch for switching a deflection direction at high speed, and generates a short-pulse $CO_2$ laser beam having a pulse width of about 10 ns to 100 ns. When a laser beam having pulse width of about 100 ns may be utilized, an acoustic-optic element (AO element) can be used instead of the BO Pockels cell.

A P-polarized laser beam generated in the oscillator part 10 goes and returns multiple times between the resonator mirror 11 and the resonator mirror 12 while applying no voltage to the EO Pockels cell 13, and the laser beam can be amplified by transferring energy of the laser medium to the laser beam. A window 19 transmitting a resonating laser beam is formed at a wall of a slab laser housing 32 of the oscillator part 10.

When applying a voltage to the EO Pockels cell 13 so as to make a phase shift corresponding to $\lambda/4$ wavelength, the P-polarized $CO_2$ laser beam generated in the oscillator part 10 becomes S-polarized light while the laser beam goes and returns through the EO Pockels cell 13, and therefore, it is reflected by the polarizer 14 and incident upon the coupling mirror 15 which is a high-reflection (HR) mirror.

The $CO_2$ laser beam reflected by the coupling mirror 15 is guided to an incidence mirror 21 of the amplifier part 20 and reflected, passes through an incidence window 33, and enters the slab laser housing 32 of the amplifier part 20 as a seed laser beam. The seed laser beam passes at an incident beam position (a first fixed point) 34, which is a virtual object position in an optical system, is amplified by passing through the slab type $CO_2$ laser medium part 30 serving as an amplification region, is reflected with a high reflectance by a spherically concave HR mirror serving as the first return mirror 37, is amplified by passing through the amplification region again, and is reflected with a high reflectance by a spherically concave HR mirror serving as the next return mirror 38.

The laser beam reflected by the return mirror 38 is amplified while passing through the amplification region again, is reflected with a high reflectance at the opposed return mirror 37, is amplified by passing through the amplification region, is reflected by the return mirror 38 again, and is amplified by passing through the amplification region. The amplified laser beam passes through an emission window 36, and outputted from the amplifier part 20.

The optical system including the return mirrors 37 and 38 in the amplifier part 20 of this example is configured such that a cross sectional image of the laser beam at an incident beam position (the first fixed point) 34 is transferred to an incident beam transfer image in an incident beam transfer position (a second fixed point) 35 on an optical path of the laser beam in the proximity of the emission window 36.

The advantage of this method is as follows. Even if the optical axis of the incident beam at the amplification part is rather deviated from a usual incident beam position (the first fixed point) 34, the emission beam at the incident beam transfer position (the second fixed point) 35 fluctuates to the same degree as the incident beam at the first fixed position. Consequently, the efficiency of amplification less fluctuates, a stable amplification can be obtained, and stability of the optical axis is improved. In the case of utilizing the slab type laser apparatus of this example, apparatuses in the subsequent processes may be assembled based on the incident beam transfer position (the second fixed point) 35 in the proximity of the emission window 36 as a reference point.

SECOND EXAMPLE

Figure 8:
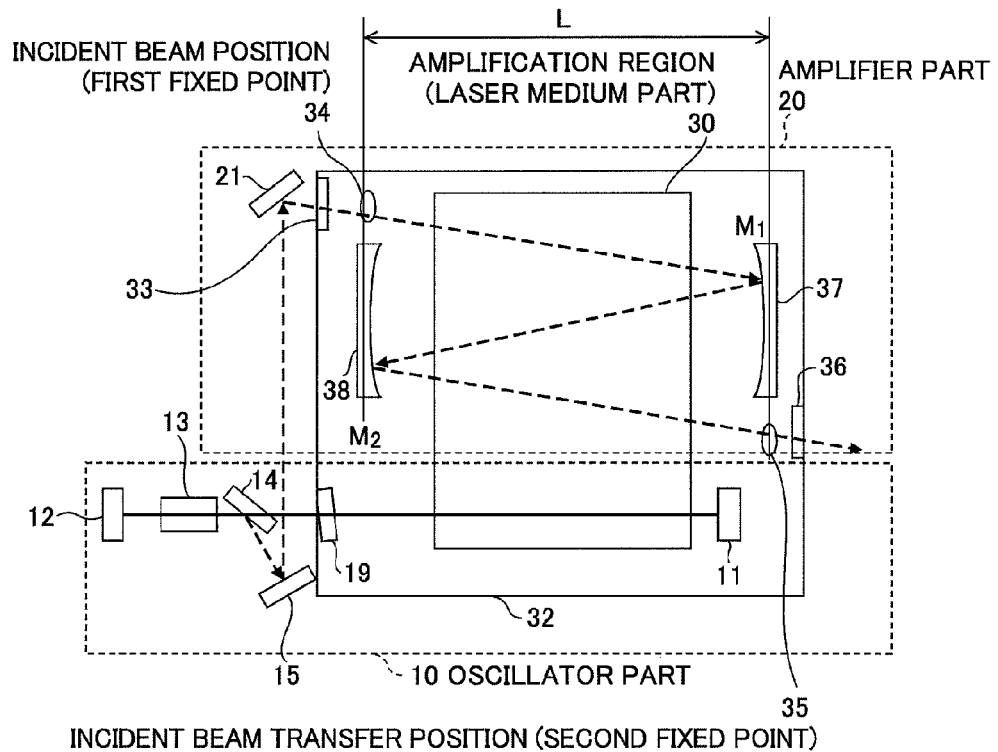
FIG. 8 is a schematic diagram showing a configuration of a slab type laser apparatus of a second example according to the second embodiment of the present invention.
Figure 9:
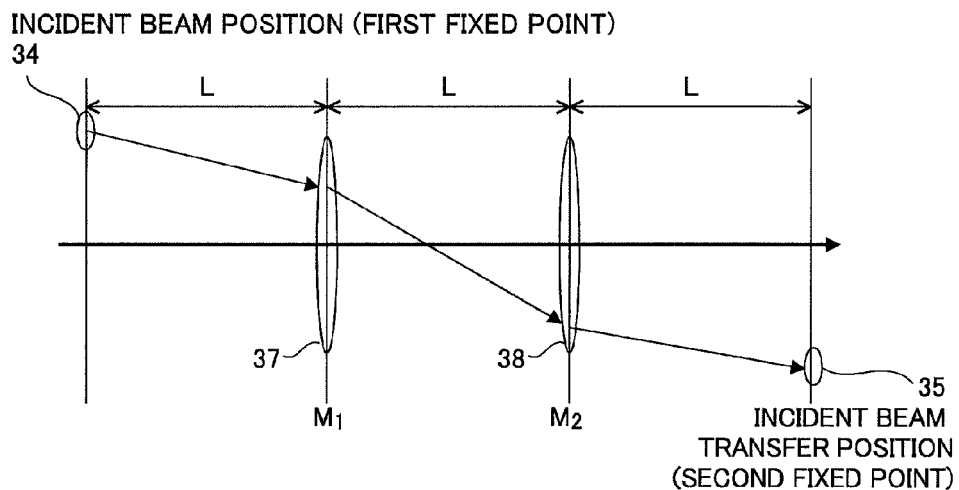
FIG. 9 is an optical system diagram of a slab type laser apparatus of the second example according to the second embodiment of the present invention.

FIGS. 8 and 9 show a slab type laser apparatus of a second example according to the second embodiment of the present invention. FIG. 8 is a schematic diagram of an oscillator part and an amplifier part in the slab type laser apparatus of this example, and FIG. 9 is an optical system diagram regarding the amplifier part of this example. The slab type laser apparatus of this example is different from the slab type laser apparatus of the first example in a feature that a laser beam is amplified via triple paths in return mirror optics of the amplifier part. With regard to the other points, the slab type laser apparatus of this example has substantially the same configuration as that of the slab type laser apparatus of the first example. A seed laser beam outputted from the oscillator part 10 by a coupling mirror 15 is reflected by an incidence mirror 21, obliquely passes through an incidence window 33, and amplified by passing through a slab type $CO_2$ laser medium part 30 serving as an amplification region. The seed laser beam is incident upon a spherically concave HR mirror serving as a return mirror 37 at an incident angle larger than zero degree and reflected with a high reflectance, and amplified in the amplification region 30 again. Subsequently, the seed laser beam is incident upon a second return mirror 38, which is a spherically concave HR mirror disposed opposite to the preceding return mirror 37, at an incident angle larger than zero degree, is reflected with a high reflectance, is amplified in the amplification region 30, and passes through an emission window 36 and is outputted.

The optical system including the return mirrors 37 and 38 in the amplifier part 20 of this example is also configured such that a cross sectional image of a laser beam at an incident beam position (the first fixed point) 34, which is set in the proximity of the incidence window 33, is transferred to an incident beam transfer image at a predetermined incident beam transfer position (the second fixed point) 35 on an optical path of the laser beam in the proximity of the emission window 36.

In general, a combined focal length F of two thin lenses M1 and M2, and a distance ZH between the principal point of one lens M1 on the front side and the front-side principal point of this combined lens system are expressed by the following equations.

$$F = f1 \cdot f2/(f1+f2-t) \quad (1)$$

$$ZH = f1 \cdot t/(f1+f2-t) \quad (2)$$

where f1 is a focal length of the front-side lens M1; f2 is a focal length of the rear-side lens M2; and "t" is a distance between the lenses.

When the distance between the position of an object and the front-side lens M1 is equal to the distance "t" between the lenses, a magnification M of a transfer image of the object in this combined lens system is expressed by the following equation.

$$M = (ZH+t-F)/F \quad (3)$$

Further, as shown in FIG. 9, the distance "t" between two thin lenses M1 and M2 is denoted as L, the distance between the incident beam position (the first fixed point) 34 corresponding to the object position and the first lens M1 is set equal to L, the distance between the incident beam transfer position (the second fixed point) 35, in which the transfer image of the cross sectional image at the incident beam position (the first fixed point) 34 is formed, and the lens M2 is set equal to L, and an image is to be formed with a magnification M=1. In addition, the concave HR mirrors 37 and 38 represented by the lens M1 and the lens M2 respectively are assumed to have the same focal length f=R/2.

When these relationships are substituted in the above-mentioned equations, the following equations hold.

$$F = f^2/(2f-L) \quad (4)$$

$$ZH = f \cdot L/(2f-L) \quad (5)$$

$$M = 1 = (ZH+L-F)/F \quad (6)$$

From the equations (4), (5) and (6), in the case where f=R/2=L, that is, the spherically concave HR mirrors 37 and 38 having a radius of curvature R=2 L are disposed in opposition at an interval of a distance L, the cross sectional image of the beam at the incident beam position (the first fixed point) 34 is transferred at 1:1 at the incident beam transfer position (the second fixed point) 35 on the optical path of the emission beam.

In the slab type laser apparatus of this example, the transfer image of the emission beam fluctuates to only the same degree as the incident beam, and therefore, even if the optical axis of the incident beam at the amplification part is rather deviated, a stable amplification can be made, and stability of the optical axis of the emission beam is improved.

THIRD EXAMPLE

Figure 10:
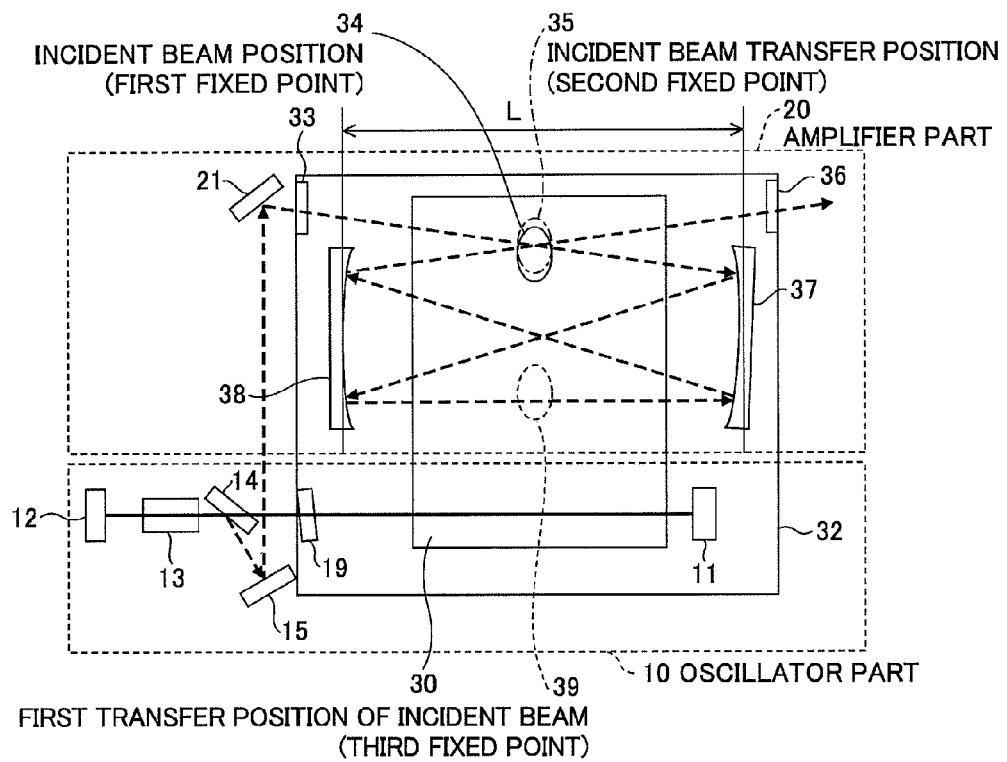
FIG. 10 is a schematic diagram showing a configuration of a slab type laser apparatus of a third example according to the second embodiment of the present invention.
Figure 11:
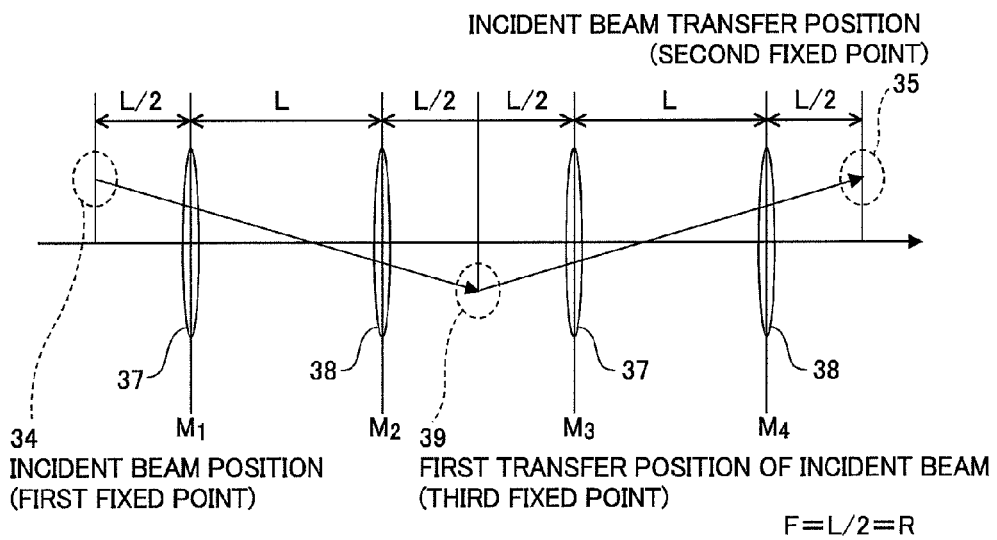
FIG. 11 is an optical system diagram of a slab type laser apparatus of the third example according to the second embodiment of the present invention.

FIGS. 10 and 11 show a slab type laser apparatus of a third example according to the second embodiment of the present invention. FIG. 10 is a schematic diagram of an oscillator part and an amplifier part in the slab type laser apparatus of this example, and FIG. 11 is an optical system diagram regarding the amplifier part of this example.

The slab type laser apparatus of this example is an modification of the slab type laser apparatus of the first example in the modification of which a laser beam is amplified via five paths in an optical system including return mirrors in the amplifier part. The slab type laser apparatus of this example is characterized in that a first transfer image derived from a cross sectional image of an incident beam at the first fixed point is formed at a third fixed point on the way of a turning optical path. And further a second transfer image derived from the first transfer image on the way of this optical path is formed at the second fixed point on the optical path of an emission laser beam. However, also in this example, the cross section of the incident beam at the first fixed point is transferred to the second fixed point on the optical path of the emission laser beam, and thereby, an optical axis is stabilized. Thus, this example has substantially the similar configuration as that of the first example.

Hereinafter, the amplifier part 20 will be explained.

The slab type laser apparatus of this example is characterized in that the beam cross sectional image at the first fixed point 34 on the incident beam optical path on the inlet side is transferred and images are formed twice, and an image is formed at the second fixed point 35 on the emission beam optical path on the outlet side. In particular, the optical system of this example is configured such that a predetermined position (the first fixed point) 34 of the incident beam is substantially coincident with the second transfer image position (the second fixed point) 35 of the incident beam on the optical path of the emission beam as the last transfer image. The configuration of such an optical system is convenient when configuring an optical system of the entire laser apparatus.

A pair of return mirrors 37 and 38 is disposed at an interval of a distance L in opposition with a part of an amplification region 30 in between. The return mirrors 37 and 38 are concave HR mirrors having a radius of curvature R, and as shown in FIG. 10, both of the return mirrors 37 and 38 are disposed to be rather inclined between each other toward the upper side such that the space sandwiched between the mirrors 37 and 38 gets slightly narrower downward.

A seed laser beam from the oscillator part 10 passes obliquely through an incidence window 33 of the amplifier part 20, and is amplified while passing through the amplification region 30. Here, a position (the first fixed point) 34 at a half of the distance L between the return mirror 37 and the return mirror 38 is set as an incident beam position in a return mirror optical system. The laser beam passed through this first fixed point and amplified is incident upon and reflected by the concave HR mirror 37 on the right side in the drawing at an incident angle and a reflection angle larger than zero degree. The laser beam is obliquely reflected downward to the left in the drawing, and further amplified by passing through the amplification region 30 again. Further, the laser beam is incident upon and reflected by the return mirror 38 on the left side in the drawing at an angle larger than zero degree, and amplified by passing through the amplification region 30 substantially horizontally in the drawing. Here, by adjusting the configuration of the optical system, the cross sectional image of the incident beam at the first fixed point 34 can be formed at the third fixed point 39 at an intermediate position between the return mirror 37 and the return mirror 38. This cross sectional image is the first transfer image of a cross section of the incident beam at the first fixed point.

The laser beam is further amplified by passing through the amplification region 30, and reflected by the return mirror 37 on the right side, and this time, deflected upward to the left in the drawing and amplified in the amplification region 30. Then, the laser beam is reflected upward to the right by the return mirror 38 on the left side, amplified in the amplification region 30, and passes through an emission window 36 as an emission beam. Furthermore, the laser beam enters another laser amplifier, and is further amplified to have high-power. The amplified laser beam is supplied to, for example, an exposure unit or a laser processing unit in the subsequent processes. At this time, the return mirror optical system forms the second transfer image of the incident beam at the second fixed point 35 at an intermediate position between the return mirror 37 at left and the return mirror 38 at right on the optical path of the laser beam going from the return mirror 37 on the left side, where the laser beam is last reflected, toward the emission window 36, based on the first transfer image formed at the third fixed point 39. Incidentally, the position (the second fixed point) 35, where the second transfer image of the incident beam is formed, can be overlapped with the incident beam position (the first fixed point) 34.

FIG. 11 is an optical system diagram showing the optical system by replacing reflection elements with transmission elements in the amplifier part of this example.

In the optical system of this example, different from the optical system of the example as shown in FIG. 9, when f1=f2=L/2 and t=L are substituted in the equation (1), a combined focal length becomes infinite, and the equations (1), (2) and (3) cannot be applied. Such an optical system is generally referred to as an a focal system. Assuming that the focal lengths of the lens M1 and the lens M2 are f1 and f2 respectively, and assuming the lens M1 and the lens M2 are disposed at an interval of f1+f2, when the object is placed at a position with a distance f1 on a front side of the lens M1, the image of an object is transferred and an image is formed at a position with a distance f2 on a rear side of the lens M2.

The magnification M in the case of the a focal system is expressed by the following equation.

$$M = f1/f2 \quad (7)$$

The magnification M becomes 1 in the case where f1=f2, as in this example. Here, assuming that the focal length of the lenses M1, M2, M3 and M4 is the same focal length "f", and assuming that the distance between adjacent two lenses is L, if the relationship of L=2f is satisfied, an optical image-formation system as shown in FIG. 11 is obtained. Assuming that the radius of curvature of the concave mirrors 37 and 38 is R, this optical system is realized by satisfying the relationship of L=R.

With reference to FIG. 11, an incident beam (seed laser beam) passes through the incident beam position (the first fixed point) 34 on the optical path of the incident beam, and enters the lens M1 with the focal length "f" having the same focusing power as that of the concave HR mirror 37 on the right side in the drawing. The incident beam position (the first fixed point) 34 is positioned at a distance L/2 on the front side of the lens M1. The distance is L between the lens M1 and the lens M2 having the focal length "f" and the same focusing power as that of the concave HR mirror 38 on the left side in the drawing. The laser beam passed through the incident beam position (the first fixed point) 34 passes through the lens M1 and the lens M2, and forms the first transfer image at the third fixed point 39, which is the position with distance L/2 behind the lens M2.

Furthermore, a lens M3 having the focal length "f" and the same focusing power as that of the concave HR mirror 37 on the right side in the drawing is provided at a position with a distance L/2 downstream with respect to the third fixed point 39 where the first transfer image is formed. Further, a lens M4 having the focal length "f" and the same focusing power as that of the concave HR mirror 38 on the left side in the drawing is provided at a position with a distance L downstream with respect to the lens M3. Then, the beam generated from a real image of the first transfer image at the third fixed point 39 forms, after passing through the lens M3 and the lens M4, the second transfer image at a position with a distance L/2 from the lens M4.

In this example, transfer images are formed twice, but the invention is not limited to this example. A beam may be transferred plural times such that an image at the first fixed point on the optical path of an incident beam is transferred and finally an image is formed at the second fixed point on the optical path of an emission beam.

In the slab type laser apparatus of this example, the transfer image of the cross section at the incident beam position (fixed point), which is transferred to a fixed point on the optical path of the emission beam, fluctuates to only the same degree as the incident beam, and stability of the emission beam is improved. In addition, the efficiency of amplification can be kept in high level, and the output of the laser is stabilized.

Furthermore, in this example, the first fixed point on the incident beam optical path of the laser amplifier and the second fixed point on the emission beam optical path are coincident with each other, and an a focal system is adopted as an optical system of this example, and therefore, the emission beam is outputted in the state in which beam quality characteristics (beam size, a beam divergence angle and the like) of the incident beam are maintained. As a result, this example has characteristics that in the case of forming an apparatus having a large amplification by connecting a number of amplifiers in series, the alignment among optical apparatuses to be connected becomes considerably easy.

FOURTH EXAMPLE

Figure 12:
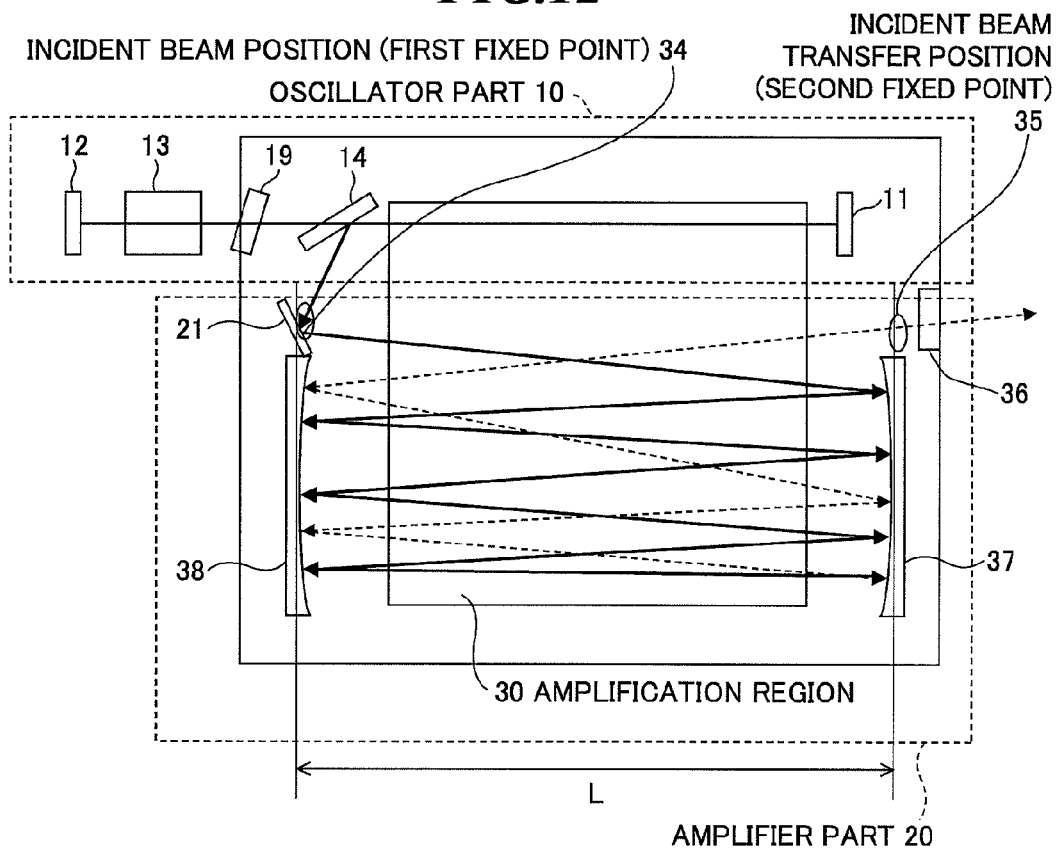
FIG. 12 is a schematic diagram showing a configuration of a slab type laser apparatus of a fourth example according to the second embodiment of the present invention.
Figure 13:
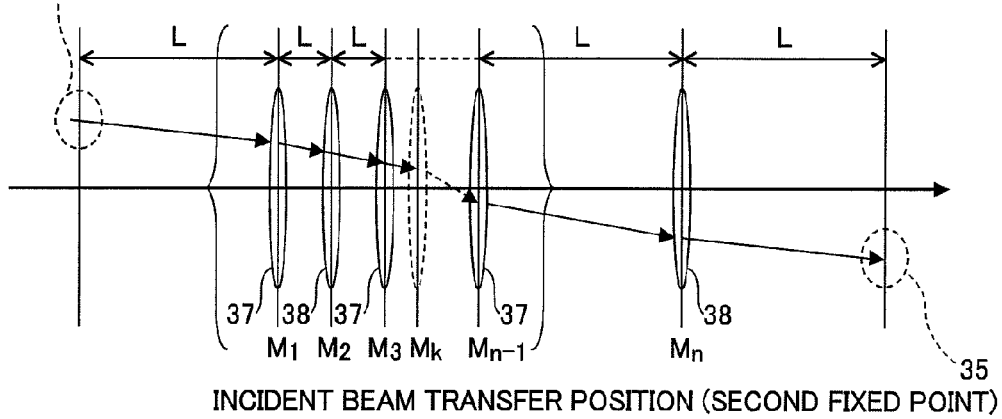
FIG. 13 is an optical system diagram of a slab type laser apparatus of the fourth example according to the second embodiment of the present invention.

FIGS. 12 and 13 show a slab type laser apparatus of a fourth example according to the second embodiment of the present invention. FIG. 12 is a schematic diagram of an oscillator part and an amplifier part in the slab type laser apparatus of this example, and FIG. 13 is an optical system diagram regarding the amplifier part of this example.

The slab type laser apparatus of this example is a slab type laser apparatus of multi-path amplification type having substantially a similar configuration to the first example. The slab type laser apparatus of this example differs from the slab type laser apparatus of the first example in that an incidence mirror for taking a seed laser beam as an incident beam outputted from a polarizer in the oscillator part into an return mirror optical system directly from the side face of the amplifier part is provided by the side of a return mirror in the amplifier part, and that the laser beam goes and returns in a zigzag manner of multi-path in the return mirror optical system.

The slab type laser apparatus of this example as shown in FIG. 12 includes a pair of resonator mirrors 11 and 12 of high reflectance as a resonator of an oscillator in the oscillator part 10 located at the upper portion in the drawing, and a Pockels cell 13, a window 19, a polarizer 14 and an amplification region 30 are disposed in this order inside the resonator. A pulse laser beam outputted from the polarizer 14 enters directly the amplifier part 20 as a seed laser beam, is reflected downward to the right in the drawing by an incidence mirror 21, and enters the return mirror optical system that includes a pair of return mirrors 37 and 38 of a concave HR mirror disposed in opposition. A return mirror optical system is formed such that the position of the incidence mirror 21 is substantially coincident with an incident beam position (the first fixed point) 34.

A seed laser beam having entered the return mirror optical system via the incidence mirror 21 is amplified by passing through the amplification region 30 (the first path), and incident upon and reflected by the return mirror 37 at an angle larger than zero degree on the right side in the drawing and thus reflected downward to the left. Then, the seed laser beam is amplified by passing through the amplification region 30 (the second path), and incident upon and reflected by the return mirror 38 on the left side in the drawing at an angle larger than zero degree and thus reflected downward to the right. Further, the seed laser beam is amplified by passing through the amplification region 30 (the third path), and incident upon and reflected by the return mirror 37 on the right side in the drawing at an angle larger than zero degree and thus reflected downward to the left. In the fourth path, the fifth path, and the sixth path, likewise, it is repeated for the seed laser beam to be incident upon and reflected at an angle larger than zero degree and thus reflected downward, and then, the seed laser beam is reflected in a horizontal direction by the return mirror 38 on the left side and amplified by passing through the amplification region 30 (the seventh path).

Thereafter, as indicated by dotted lines in the drawing, in the eighth path to the eleventh path, it is repeated for the seed laser beam to be reflected obliquely upward at an angle larger than zero degree by the return mirror and amplified by passing through the amplification region 30. In the eleventh path, the seed laser beam is amplified by passing through the amplification region 30, and passes through an emission window 36 and is outputted as an emission beam. At the second fixed point 35 in the eleventh path and by the side of the return mirror 37 on the right side in the drawing, a transfer image is formed by transferring a cross sectional image of the incident beam at a point of the incidence mirror 21 which corresponds to the first fixed point 34.

FIG. 13 shows an optical system diagram in which transmission elements in the optical system of this example are substituted for the reflection elements and developed in series.

In the case of multi-path amplification in which concave mirrors are disposed on both sides of the turning (concave HR) mirror system, the optical system as shown in FIG. 12, in which the beam cross section in the incident position of an incident beam (the first fixed point) is transferred and an image is formed at the second fixed point on the optical path of an amplified emission beam, is equivalent to an optical system as shown in FIG. 13. The optical system as shown in FIG. 13 includes a combined lens including a plurality of lenses having the same focal length f=R/2 and aligned at an interval L. And the plurality of lenses are disposed in series such that the transfer image of the cross sectional image of the incident beam at a position (the first fixed point) 34 with a distance L on the front side of the first lens M1 is formed at a position (the second fixed point) 35 with a distance L on a rear side of the final lens $M_n$.

Here, it is assumed that all of the focal lengths of (k+1) pieces of lenses ($M_1, M_2, \ldots M_{k+1}$) are the same focal length "f". Then, a combined focal length $F_{k+1}$ of these lenses, a distance $ZH_{k+1}$ between the principal point on the front side of the combined lens of k pieces of lenses ($M_1, M_2, \ldots M_k$) and the principal point of the combined lens system of (k+1) pieces of lenses ($M_1, M_2, \ldots M_{k+1}$), and a magnification M are expressed by the following equations derived from the equations (1), (2) and (3).

$$F_{k+1}=F_k\cdot f/(F_k+f-L) \tag{8}$$

$$ZH_{k+1}=F_k\cdot L/(F_k+f-L)+ZH_k \tag{9}$$

$$M=(ZH_{k+1}+L-F_{k+1})/F_{k+1} \tag{10}$$

An initial value $F_1$ of the combined focal length is "f" in the case where k=0 (in the case of only $M_1$ existing). Here, by the sequential calculation from $F_1$ to $F_n$ using the equations (8), (9) and (10), the focal length $F_n$ of the combined lens of n pieces of lenses ($M_1, M_2, \ldots M_n$) and the front-side principal point position $ZH_n$ thereof can be obtained, and the focal length "f" of each lens can be obtained so that the magnification M is satisfied to be about 1.

For example, assuming that the distance L between a pair of return mirrors is 1000 mm and the magnification M=1 in the case of eleven-path amplification, "f" becomes about 11000 mm and the radius of curvature R (=2f) becomes about 22000 mm, based on the equations (8), (9) and (10).

In this example, by employing such an optical system in which a laser beam passes through the amplification region 30 obliquely from upside to downside in a zigzag manner and then further passes through the amplification region 30 from downside to upside in a zigzag manner, a high efficiency of amplification can be achieved by multi-path amplification having so many paths as eleven paths, and a stable beam track can be achieved by transferring a cross sectional image of a laser beam at the incident beam position (the first fixed point) 34, which is the same position of the incidence mirror 21, to the position of the second fixed point 35 on the optical path of an emission beam.

FIFTH EXAMPLE

Figure 14:
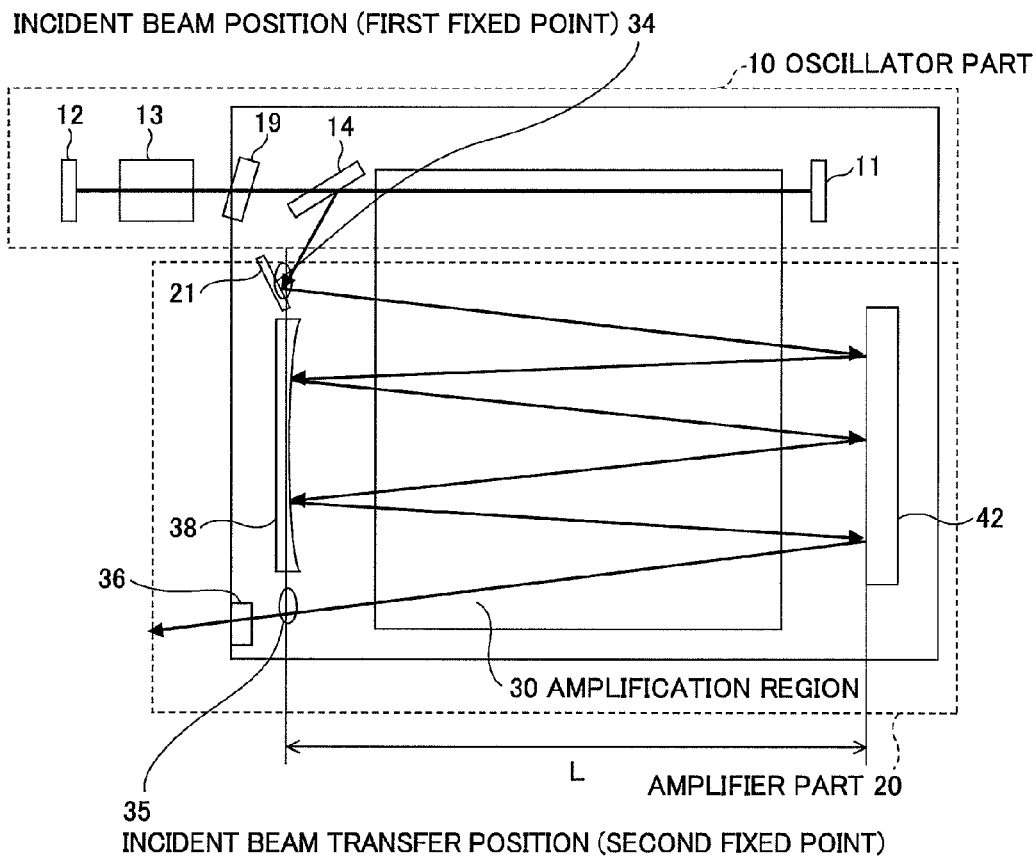
FIG. 14 is a schematic diagram showing a configuration of a slab type laser apparatus of a fifth example according to the second embodiment of the present invention.
Figure 15:
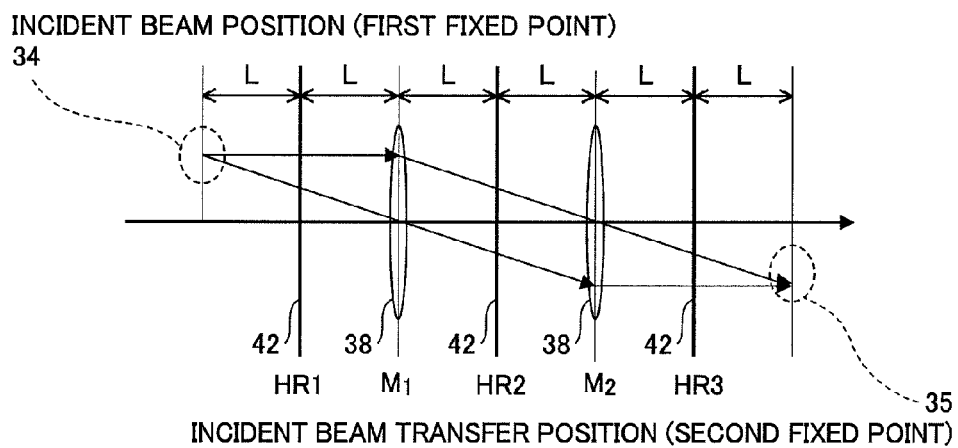
FIG. 15 is an optical system diagram of a slab type laser apparatus of the fifth example according to the second embodiment of the present invention.

FIGS. 14 and 15 show a slab type laser apparatus of a fifth example according to the second embodiment of the present invention. FIG. 14 is a schematic diagram of an oscillator part and an amplifier part in the slab type laser apparatus of this example, and FIG. 15 is an optical system diagram regarding the amplifier part of this example.

The slab type laser apparatus of this example is a slab type laser apparatus of multi-path amplification type that differs from the slab type laser apparatus of the fourth example in that six-path amplification is performed while a plane HR mirror is used as one of the return mirrors.

With reference to FIG. 14, an oscillator part 10 for emitting a seed laser beam is the same as that of the slab type laser apparatus of the fourth example as shown in FIG. 12. The incident beam (seed laser beam) supplied from the oscillator part 10 is reflected by an incidence mirror 21 in an amplifier part 20 and enters a return mirror optical system. The return mirror optical system includes a plane return mirror 42 as a plane HR mirror, and a concave return mirror 38 as a concave HR mirror.

The seed laser beam entered an amplification region 30 from the incidence mirror 21 is amplified by passing through the amplification region 30 (the first path), incident upon the plane return mirror 42 at an angle larger than zero degree, regularly reflected to go out obliquely downward, amplified by passing through the amplification region 30 (the second path), incident upon and reflected by the concave return mirror 38 at an angle larger than zero degree to go out obliquely downward, and amplified by passing through the amplification region 30 (the third path).

Further, the seed laser beam is regularly reflected by the plane return mirror 42 to go out obliquely downward, amplified by passing through the amplification region 30 (the fourth path), incident upon and reflected by the concave return mirror 38 at an angle larger than zero to go out obliquely downward, amplified by passing through the amplification region 30 (the fifth path), regularly reflected by the plane return mirror 42 to go out obliquely downward, amplified by passing through the amplification region 30 (the sixth path), and outputted as an emission beam through an emission window 36.

In this example, the return mirror optical system is configured such that the cross sectional image of the incident beam at an incident beam position (the first fixed point) 34, which is the same as that of a reflection plane of the incidence mirror 21, is transferred to an incident beam transfer position (the second fixed point) 35 on the optical path of the emission beam on the outlet side. The concave return mirror 38 and the plane return mirror 42 are disposed oppositely in parallel at a distance L, and a transfer image of a cross section of the incident beam at the first fixed point 34, which corresponds to the position of the incidence mirror 21, is formed at the second fixed point 35 on the outlet side. The first fixed point 34 and the second fixed point 35 are set in positions aligned by the sides of the concave return mirror 38.

FIG. 15 shows an optical system diagram in which transmission elements in the optical system of this example are substituted for reflection elements and the transmission elements are developed in series. In FIG. 15, plane transparent plates HR1, HR2, and HR3 representing the plane return mirror 42 have no focusing power, and therefore, the optical system of this example has substantially the same configuration as that shown in FIG. 9. This configuration has a positional relationship in which the distance is 2 L between two pieces of lenses M1 and M2 which correspond to one piece of the concave return mirror 38, and the incident beam position (the first fixed point) 34 is positioned at a distance 2 L on the front side of the lens M1 and the transfer image of the incident beam cross section at the first fixed point is formed at the incident beam transfer position (the second fixed point) 35 at a distance 2 L beyond the lens M2.

A combined focal length F, a distance between principal points ZH and a magnification M can be obtained by the following equations in which 2 L is substituted for L in the equations (4), (5) and (6).

$$F = f^2/(2f-2L) \quad (11)$$

$$ZH = f \cdot 2L/(2f-2L) \quad (12)$$

$$M = 1 - (ZH + 2L - F)/F \quad (13)$$

Assuming that the radius of curvature is R, the focal length "f" of the concave return mirror 38 has a relationship f=R/2=2 L as obvious from FIG. 15, and therefore, the radius of curvature R=4 L.

In the slab type laser apparatus of this example, the position and the angle of the emission beam fluctuate only to the same degree as those of the incident beam. Accordingly, even if the optical axis of the incident beam at the amplifier part is rather deviated, the efficiency of amplification is unlikely to fluctuate, a stable amplification can be obtained, and the stability of the optical axis is improved. Furthermore, one of the features of the slab type laser apparatus of this example is that the incident beam and the emission beam are located on both side faces sandwiching the concave return mirror 38.

SIXTH EXAMPLE

Figure 16:
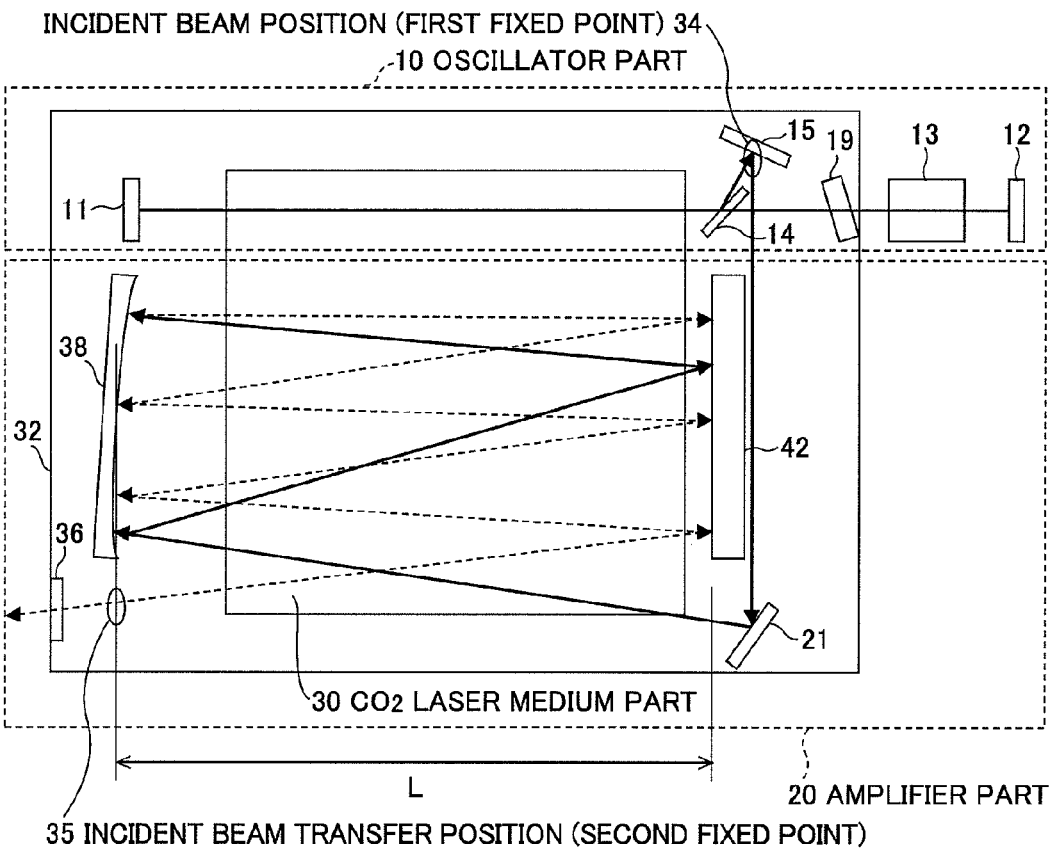
FIG. 16 is a schematic diagram showing a configuration of a slab type laser apparatus of a sixth example according to the second embodiment of the present invention.
Figure 17:
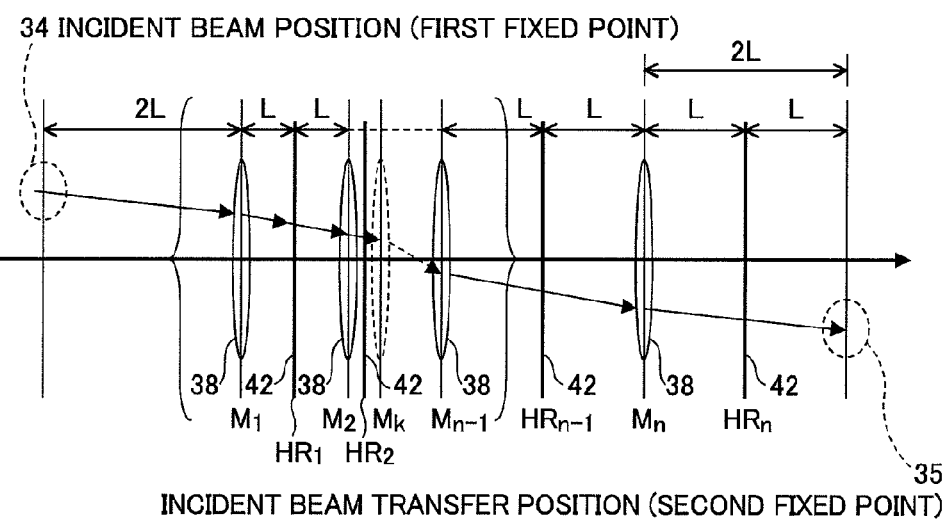
FIG. 17 is an optical system diagram of a slab type laser apparatus of the sixth example according to the second embodiment of the present invention.

FIGS. 16 and 17 show a slab type laser apparatus of a sixth example according to the second embodiment of the present invention. FIG. 16 is a schematic diagram of an oscillator part and an amplifier part in the slab type laser apparatus of this example, and FIG. 17 is an optical system diagram regarding the amplifier part of this example.

The slab type laser apparatus of this example is a slab type laser apparatus of multi-path amplification type that differs from the slab type laser apparatus of the fifth example in that a concave return mirror is disposed to form an angle with respect to a plane HR mirror.

With reference to FIG. 16, an oscillator part 10 is provided with a coupling mirror 15 for entering a laser beam from the oscillator part 10 to an amplifier part 20. The laser beam that passes through a window 19 and resonates between resonator mirrors 11 and 12 is outputted from the oscillator part 10 through a polarizer 14 and the coupling mirror 15, and supplied to the amplifier part 20 as a seed laser beam. The seed laser beam supplied to the amplifier part 20 is reflected by an incidence mirror 21 and enters an optical system as described below. This optical system includes a plane return mirror 42 and a concave return mirror 38 which are disposed opposite to each other at a distance L. Here, the plane return mirror 42 and the concave return mirror 38 are a plane HR mirror and a spherical HR mirror, respectively.

The plane return mirror 42 and the concave return mirror 38 are disposed not in parallel but with a slight angle. In FIG. 16, the concave return mirror 38 is disposed closer to the plane return mirror 42 at the upper portion in the drawing, and farther at the lower portion in the drawing. With the arrangement in which the plane return mirror 42 and the concave return mirror 38 are disposed in a slightly inclined manner to each other, multi-path amplification having a larger number of paths can be achieved.

Furthermore, in the return mirror optical system, an incident beam position (the first fixed point) 34 is arranged to be substantially coincident with a reflection plane of the coupling mirror 15 for reflecting the seed laser beam outputted to the outside of the resonator including the oscillator mirrors 11 and 12. As a result, the first fixed point 34 as an object position becomes considerably stable. Thus, the return mirror optical system is configured such that the incident beam position (the first fixed point) 34 is at a position on the optical path with a distance 2 L on the front side of the position in which an incident beam is first impinged on the concave return mirror 38. In addition, this return mirror optical system is configured such that the position of an incident beam transfer position (the second fixed point) 35, which is set in the proximity of an emission window 36, is at a position on the optical path with a distance 2 L on the rear side of the position in which the emission beam is finally reflected by the concave return mirror 38.

The incident beam having entered the return mirror optical system is amplified by passing through an amplification region 30 obliquely upward in the drawing (the first path), incident upon and reflected by the concave return mirror 38 at an angle larger than zero degree with respect to the concave return mirror 38 to go out obliquely upward, amplified by passing through the amplification region 30 (the second path), regularly reflected by the plane return mirror 42 to go out obliquely upward, and amplified by passing through the amplification region 30 (the third path). Furthermore, the incident beam is incident upon and reflected by the concave return mirror 38 at an angle larger than zero degree, but since the reflection plane of the concave return mirror 38 faces downward in the drawing, the incident beam goes out obliquely downward at this time as indicated by dotted lines in the drawing. The incident beam reflected by the concave return mirror 38 is amplified by passing through the amplification region 30 (the fourth path), regularly reflected by the plane return mirror 42 to go out obliquely downward, and amplified by passing through the amplification region 30 (the fifth path).

The incident beam is subsequently incident upon and reflected by the concave return mirror 38 at an angle larger than zero degree to go out obliquely downward, amplified by passing through the amplification region 30 (the sixth path), regularly reflected by the plane return mirror 42 to go out obliquely downward, and amplified by passing through the amplification region 30 (the seventh path). Further, the incident beam is incident upon and reflected by the concave return mirror 38 at an angle larger than zero degree to go out obliquely downward, amplified by passing through the amplification region 30 (the eighth path), regularly reflected by the plane return mirror 42 to go out obliquely downward, amplified by passing through the amplification region 30 (the ninth path), and then, passes through the emission window 36 and is outputted as an emission beam.

At this time, by the function of the return mirror optical system, the cross sectional image of the laser beam at the reflection plane (the first fixed point) 34 of the coupling mirror 15 is transferred to the position (the second fixed point) 35 at a distance L on the rear side from the plane return mirror 42 on the optical path of an emission beam.

With reference to FIG. 17, the distance is 2 L from the incident beam position (the first fixed point) 34 to the first concave return mirror 38, the distance is L between a respective one of concave return mirrors 38 and a respective one of plane return mirrors 42, and the distance is L from the final plane return mirror 42 to the incident beam transfer position (the second fixed point) 35. However, the plane return mirror 42 has no focusing power, and therefore, there is a relationship in which the distance is 2 L between adjacent two lenses (for example, M1 and M2) corresponding to the concave return mirror 38 with a focal length "f", the first fixed point 34 is positioned at a distance 2L on the front side of the lens M1, and the incident beam transfer position (the second fixed point) 35 is positioned at a distance 2L apart on the rear side of the final lens $M_n$.

In the case of using a distance D=2 L between mirrors (or lenses), a combined focal length $F_k$ of k pieces of mirrors (or lenses), a distance $ZH_k$ between principal points, and a magnification M can be obtained from the following equations in which 2 L is substituted for L in the equations (8), (9) and (10).

$$F_{k+1} = F_k \cdot f/(F_k + f - 2L) \quad (14)$$

$$ZH_{k+1} = F_k \cdot 2L/(F_k + f - 2L) + ZH_k \quad (15)$$

$$M = (ZH_{k+1} + 2L - F_{k+1})/F_{k+1} \quad (16)$$

An initial value $F_1$ is "f" for the combined focal length in the case where k=0. Here, by the sequential calculation from $F_1$ to $F_n$ by using the equations (14), (15) and (16), the combined focal length $F_n$ and the front-side principal point position $ZH_n$ of n pieces of mirrors (or lenses) ($M_1$, $M_2$, ... $M_n$) are obtained, and the focal length "f" of each mirror (or lens) can be obtained such that the magnification M is satisfied to be about 1.

For example, in the case where L=600 mm and nine-path amplification is performed, the radius of curvature R is about 7200 mm.

The advantage of this method is that by passing through a number of paths in the amplification region, the energy of the laser medium is more effectively used to obtain a laser beam of high power. In addition, since the beam cross sectional image that hardly fluctuates at the position of the coupling mirror 15 in the oscillator part 10 is transferred and an image is formed while the laser beam is outputted, the position and the angle of a laser output beam after amplification are stabilized.

SEVENTH EXAMPLE

Figure 18:
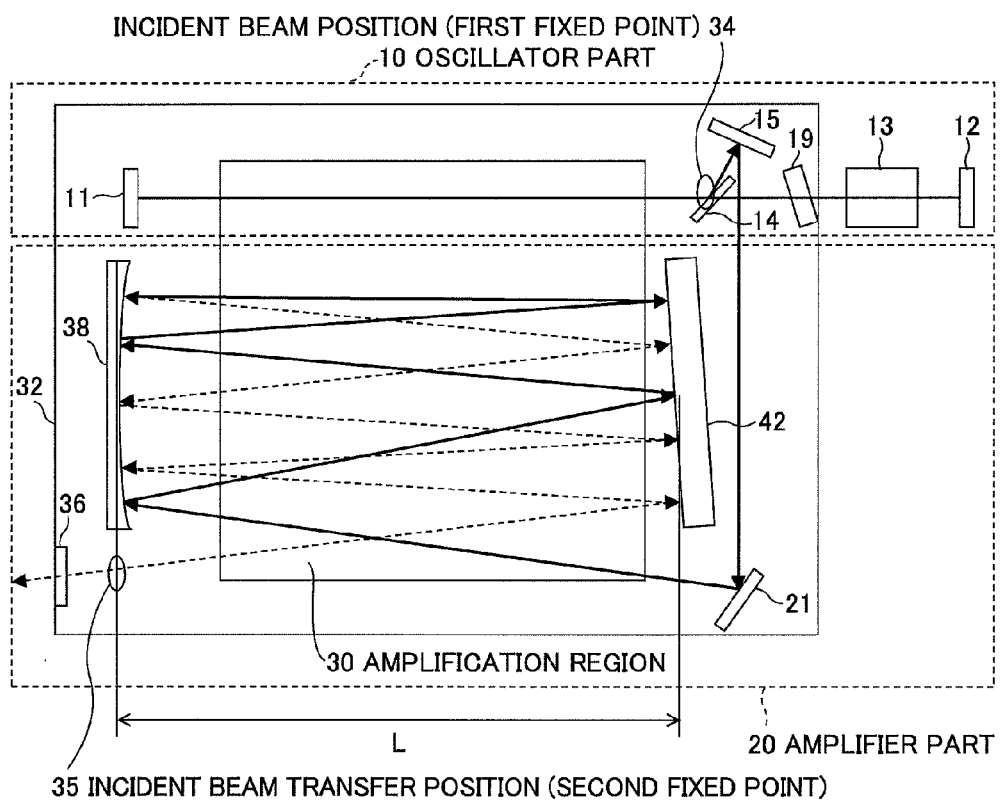
FIG. 18 is a schematic diagram showing a configuration of a slab type laser apparatus of a seventh example according to the second embodiment of the present invention.

FIG. 18 is a schematic diagram of an oscillator part and an amplifier part in a slab type laser apparatus of a seventh example according to the second embodiment of the present invention. Incidentally, an optical system diagram regarding the amplifier part of this example is not different essentially from FIG. 17, and the optical system diagram is omitted.

The slab type laser apparatus of this example has substantially the same configuration as that of the slab type laser apparatus of the sixth example shown in FIG. 16, and is a slab type laser apparatus of multi-path amplification type in which a concave return mirror is disposed perpendicular to a housing, and a plane HR mirror is disposed in opposition at a some angle to the concave return mirror. In the slab type laser apparatus of this type, the number of paths can be properly changed by adjusting focusing power, length or included angle of a return mirror, incident angle of a seed laser beam and the like. In the example as shown in FIG. 18, the number of paths is eleven.

In the slab type laser apparatus of this example, a laser beam that resonates between resonator mirrors 11 and 12 is supplied from an oscillator part 10 to an amplifier part 20 through a polarizer 14 and a coupling mirror 15. The seed laser beam supplied to the amplifier part 20 is reflected by an incidence mirror 21 and enters the return mirror optical system including a plane return mirror 42 and a concave return mirror 38 disposed opposite each other at a distance L.

In the slab type laser apparatus of this example, the concave return mirror 38 is disposed perpendicular to a slab laser housing 32, and the plane HR mirror 42 is disposed inclined in a direction of approaching the concave return mirror 38 at the upper end in the drawing.

The incident beam reflected by the incidence mirror 21 and entered the return mirror optical system is amplified by passing through an amplification region 30 obliquely upward in the drawing (the first path), incident upon and reflected by the concave return mirror 38 with an angle larger than zero degree to go out obliquely upward, amplified by passing through the amplification region 30 (the second path), regularly reflected by the plane return mirror 42 to go out obliquely upward, and amplified by passing through the amplification region 30 (the third path). Subsequently, the incident beam is incident upon and reflected by the concave return mirror 38 with an angle larger than zero degree to go out obliquely upward, amplified by passing through the amplification region 30 (the fourth path), regularly reflected by the plane return mirror 42 to go out substantially in parallel to the wall of the housing 32, and amplified by passing through the amplification region 30 (the fifth path).

The incident beam further is incident upon and reflected by the concave return mirror 38 with an angle larger than zero degree, but this time the incident beam goes out obliquely downward at an incident point of the incident beam as indicated by dotted lines in the drawing, since the reflection plane of the concave return mirror 38 faces downward. The incident beam reflected by the concave return mirror 38 is amplified by passing through the amplification region 30 (the sixth path), regularly reflected by the plane return mirror 42 to go out obliquely downward, and amplified by passing through the amplification region 30 (the seventh path).

The incident beam subsequently is incident upon and reflected by the concave return mirror 38 with an angle larger than zero degree to go out obliquely downward, amplified by passing through the amplification region 30 (the eighth path), regularly reflected by the plane return mirror 42 to go out obliquely downward, and amplified by passing through the amplification region 30 (the ninth path). Further, the incident beam is incident upon and reflected by the concave return mirror 38 with an angle larger than zero degree to go out obliquely downward, amplified by passing through the amplification region 30 (the tenth path), regularly reflected by the plane return mirror 42 to go out obliquely downward, amplified by passing through the amplification region 30 (the eleventh path), and then, passes through the emission window 36 and is outputted as an emission beam.

At this time, by the function of the return mirror optical system, the cross sectional image of the laser beam in an incident beam position (the first fixed point) 34 corresponding to a reflection plane of the polarizer 14 is transferred to an incident beam transfer position (the second fixed point) 35 corresponding to the position at a distance L from the plane return mirror 42 on the optical path of the emission beam.

The optical system of this case is configured such that an optical path length is 2 L from the incident beam position (the first fixed point) 34 to the first concave return mirror 38, and respective distances are L between the concave return mirror 38 and the plane return mirror 42, and the distance is 2 L from the last concave return mirror 38 to the incident beam transfer position (the second fixed point) 35.

The combined focal length F and the distance between principal points ZH can be obtained from the equations (14), (15) and (16). For example, in the case where M=1, L=1800 mm, and eleven-path amplification is performed, the radius of curvature R is to be about 30000 mm.

Although the advantage of this method is the same as that of the sixth example, further an advantage of this method is to be more easy to make design and alignment of the apparatus, since the optical path is controlled by adjusting the plane return mirror 42 while the concave return mirror 38 is fixed of which position and posture are hard to be adjusted in usual.

Embodiment 3

Figure 19:
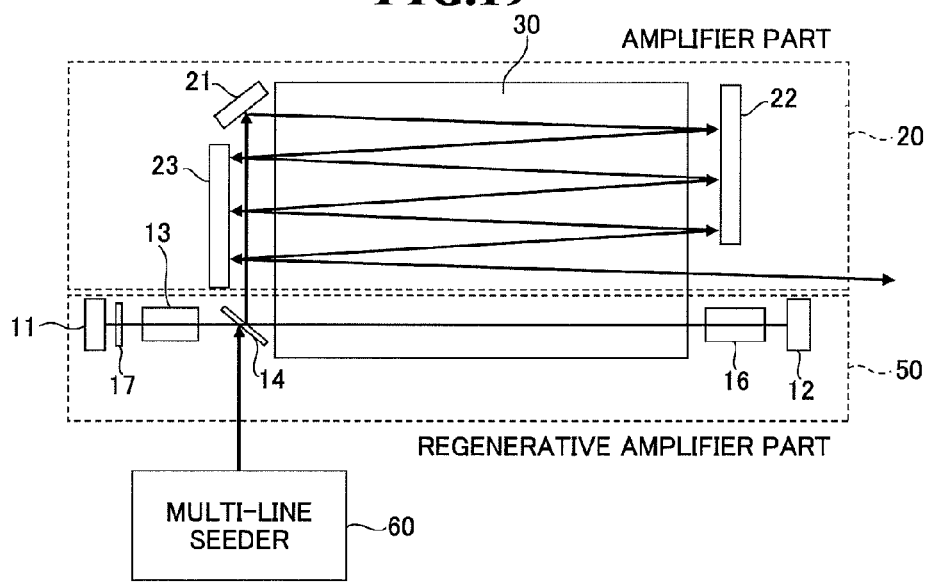
FIG. 19 is a schematic diagram showing a configuration of a slab type laser apparatus of a first example according to a third embodiment of the present invention.

FIG. 19 is a schematic diagram showing a configuration of a slab type laser apparatus according to a third embodiment of the present invention.

The slab type laser apparatus according to this embodiment has a configuration in which a regenerative amplifier part 50 and an amplifier part 20 are integrated together with a one-piece $CO_2$ laser medium part 30, and in which a $CO_2$ laser beam of a seed laser beam introduced from an excitation light generator such as a multi-line seeder 60 is regenerated and is amplified between resonator mirrors, thereafter laser-amplified to have high power and supplied to an EUV light source apparatus.

The regenerative amplifier part 50 is a substitute for the oscillator part 10 in the first embodiment, and includes a part of a $CO_2$ laser medium part 30, and is configured to have a second EO Pockels cell 16 and a $\lambda/4$ wavelength plate 17 in addition to a pair of resonator mirrors 11 and 12, a first EO Pockels cell 13 and a polarizer 14. Incidentally, the polarizer 14 has a coupling function of deflecting a laser beam to the amplifier part 20, so that a coupling mirror is unnecessary.

The regenerative amplifier part 50 receives oscillation light from the multi-line seeder 60 that is formed of, for example, a $CO_2$ laser or a solid laser, and amplifies it during its repeated go and return movement in the regenerative amplifier part 50 to output the amplified light. Here, as examples of the multi-line seeder, there may be a multi longitudinal mode semiconductor laser being oscillated in wavelengths of amplification lines of the $CO_2$ laser, or a multiplexed light component combined with light components from a plurality of single longitudinal mode semiconductor lasers.

When oscillation light, which is S-polarized light, enters the apparatus from the multi-line seeder 60, the incident light is reflected by the polarizer 14 and is injected into the regenerative amplifier part 50. The injected light is changed to be P-polarized light during its go and return movement through the $\lambda/4$ wavelength plate 17, and therefore the injected light passes through the polarizer 14, is reflected by the resonator mirror 12 on the front side to return, and passes through the polarizer 14 again.

The function of the regenerative amplifier 50 will be described in more detail. The S-polarized seed laser beam is injected toward the reflection plane of the polarizer 14 from the multi-line seeder 60. This seed laser beam is highly reflected by the polarizer 14 and injected into the resonator of the regenerative amplifier part 50. The injected seed laser beam passes through the first EO Pockels cell 13 as it is, and is converted to circularly polarized light by the $\lambda/4$ wavelength plate 17. Further, the seed laser beam is changed to P-polarized light, when it is turned at the resonator mirror 11 and passes through the $\lambda/4$ wavelength plate 17 again. The seed laser beam passes through the first EO Pockels cell 13 as it is in the P-polarized light state to pass through the polarizer 14. Then, this P-polarized laser beam passes through the $CO_2$ laser medium part 30 and is amplified, passes through the second EO Pockels cell 16 as it is in the P-polarized light state, is reflected by the resonator mirror 12 on the front side to return, passes through the second EO Pockels cell 16 and the $CO_2$ laser medium part 30 again and is amplified, and passes through the polarizer 14 in the P-polarized light state.

The P-polarized laser beam passed through the polarizer 14 is changed to be S-polarized light when it goes and returns to pass through the $\lambda/4$ wavelength plate 17, so that it will be reflected by the polarizer 14. Thus, by applying a voltage for a $\lambda/4$ wavelength to the EO Pockels cell 13, the seed laser beam further rotates the plane of polarization to be P-polarized light, and the seed laser beam can pass through the polarizer 14.

The above-mentioned contents will be described in more detail. In the case of no voltage applied to the first EO Pockels cell, the P-polarized laser beam passed through the polarizer 14 is changed to S-polarized light when it goes and returns to pass through the $\lambda/4$ wavelength plate 17, so that the laser beam will be highly reflected by the polarizer 14. Then, by applying a voltage to the first EO Pockels cell 13 so as to make a phase shift corresponding to $\lambda/4$ wavelength, the laser beam passes through the first EO Pockels cell 13 and the $\lambda/4$ wavelength plate 17, and thereby the laser beam is converted to the S-polarized light from the P-polarized light. Further, the laser beam is reflected by the resonator mirror 11, then the laser beam passes through the $\lambda/4$ wavelength plate 17 and the first EO Pockels cell 13 again, thereby it is converted to the P-polarized light from the S-polarized light to pass through the polarizer 14.

In the state in which a voltage corresponding to the $\lambda/4$ wavelength is applied to the first EO Pockels cell 13, the laser beam goes and returns many times between the resonator mirrors 11 and 12 to amplify the output power of the laser beam by the $CO_2$ laser medium. In other words, in the state in which a voltage is applied to the first EO Pockels cell 13 so as to make a phase shift corresponding to λ/4 wavelength, the seed laser beam from the multi-line seeder goes and returns many times between the resonator mirrors 11 and 12 to perform efficient amplification by the $CO_2$ laser medium.

At the time the seed laser beam is sufficiently amplified at the $CO_2$ laser medium part 30 in the regenerative amplifier part 50, if the voltage for λ/4 wavelength is applied to the second EO Pockels cell 16, then the laser beam in the regenerative amplifier part 50 is changed to S-polarized and reflected by the polarizer 14, and then, enters the amplifier part 20.

After the laser beam in the regenerative amplifier part 50 is discharged, if the voltage is turned to zero to be applied to the first EO Pockels cell 13 and the second EO Pockels cell 16, then oscillation light from the multi-line seeder 60 can be taken in the regenerative amplifier part 50.

The amplifier part 20 includes a part of the $CO_2$ laser medium part 30, and is provided with an incidence mirror 21 and a pair of return mirrors 22 and 23.

The amplifier part 20 is the same as that of the first embodiment, so that both the return mirror 22 and the return mirror 23 opposite thereto may be plane mirrors as shown in FIG. 1. It is possible, however, that one mirror is a concave mirror or that both of the mirrors be concave mirrors as a matter of course. In addition, it is preferable that one is a concave mirror and the other is a convex mirror, so that the electric discharge part of large cross sectional area may be effectively utilized. Furthermore, it is preferable that a pair of reflecting mirrors are disposed in each going and returning optical path.

Furthermore, it is possible that a saturable absorber, a spatial filter or the like be interposed to suppress a parasitic oscillation at the amplifier part 20.

The $CO_2$ laser beam entered the amplifier part 20 from the regenerative amplifier part 50 is multi-path-reflected between the return mirror 22 and the return mirror 23 opposite thereto that are disposed in parallel, and finally supplied to an EUV light generation chamber or another $CO_2$ laser amplifier through an output window of the slab type laser apparatus.

The $CO_2$ laser beam is amplified in output power during its go and return movement in the excited $CO_2$ laser medium, and becomes a high-power laser beam.

In the slab type laser apparatus according to this embodiment, as compared to a conventional slab type laser apparatus, the $CO_2$ laser medium is commonly used by the amplifier part 20 and the regenerative amplifier part 50, so that the configuration of an apparatus is simplified and downsized. Furthermore, since the laser beam goes and returns an arbitrary number of times in the same $CO_2$ laser medium at the regenerative amplifier part 50 and at the amplifier part 20 and can receive a sufficient energy transfer, a $CO_2$ laser having high oscillation efficiency and of high power can be obtained.

That is, because the regenerative amplifier part 50 and the amplifier part 20 are operated in the same $CO_2$ laser medium, and because a laser beam is multi-path-amplified at the amplifier part 20, the efficiency of amplification becomes high and thus a high-power $CO_2$ laser can be obtained, as well as a compact slab laser apparatus will be obtained.

The slab type laser apparatus according to this embodiment becomes a short-pulse $CO_2$ laser oscillator realizing space saving and high-power.

Incidentally, as mentioned above, the case in which a laser beam to be injected is a laser beam obtained from a multi-line seeder, but it is also preferable that a laser beam be supplied using a single-line seeder.

Figure 20:
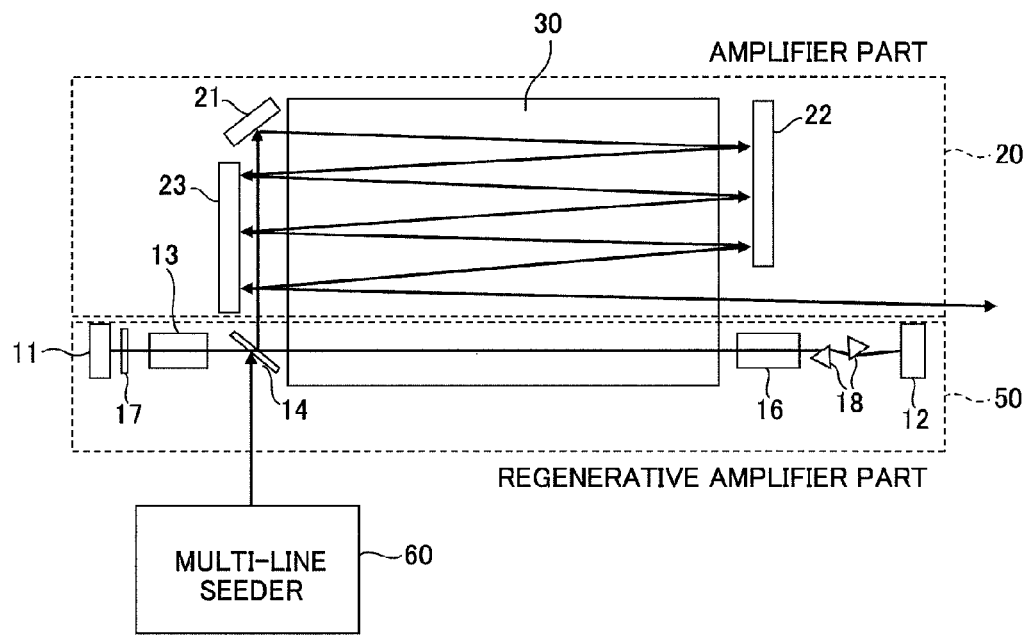
FIG. 20 is a schematic diagram showing a configuration of a slab type laser apparatus of a second example according to the third embodiment of the present invention.

FIG. 20 is a schematic diagram showing another example of this embodiment.

Comparing to the laser apparatus as shown in FIG. 19, the slab type laser apparatus of this example differs only in that a pair of prisms 18 is inserted in a laser optical path of a regenerative amplifier part 50, and the others are exactly the same.

By the insertion of a pair of the prisms 18 in the regenerative amplifier part 50, fine adjustments of the optical distance between resonator mirrors 11 and 12 can be obtained. Therefore, a wavelength selection and a wavelength adjustment of the output laser beam is easily made, since the wavelength selection can be made even in the case of using the multi-line seeder 60, and the resonance adjustment can be made when using a single-line seeder.

Incidentally, the optical axis of an output laser beam can be stabilized as a matter of course, by applying to the slab type laser apparatus according to this embodiment with an amplifier part which is obtained by improving the optical system of the multi-path amplifier of the amplifier part 20 as disclosed for the above-mentioned second embodiment, and in which a beam cross sectional image at the incident beam position (the first fixed point) is transferred to the incident beam transfer position (the second fixed point) existing in the proximity of the outlet.

Embodiment 4

FIGS. 21-25 are drawings showing a slab type laser apparatus according to a fourth embodiment of the present invention. The slab type laser apparatus according to this embodiment is a $CO_2$ laser apparatus to supply a laser beam to a target material in an extreme ultraviolet light source apparatus. This embodiment is to apply an oscillator part having a simplified optical system to an amplifier part that is provided with a return mirror optical system having plane mirrors disposed opposite each other to be substantially in parallel, and other than the oscillator part has substantially the same configuration as that of the slab type laser apparatus of the first example according to the first embodiment.

FIRST EXAMPLE

Figure 21:
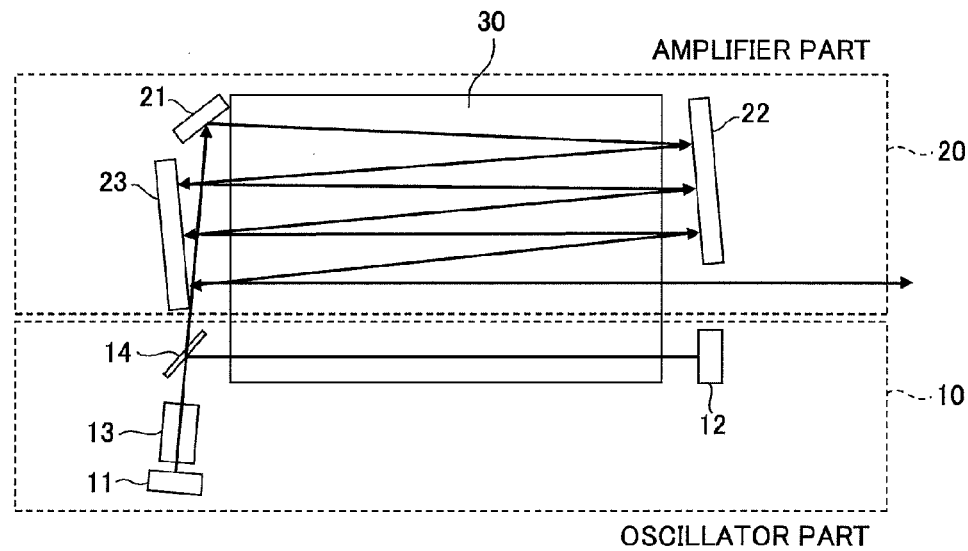
FIG. 21 is a schematic diagram showing a configuration of a slab type laser apparatus of a first example according to a fourth embodiment of the present invention.

FIG. 21 is a schematic diagram showing an exemplified configuration of a slab type laser apparatus of a first example according to the fourth embodiment of the present invention. The slab type laser apparatus of this example has a configuration in which an oscillator part 10 and an amplifier part 20 are integrated together in a one-piece slab type $CO_2$ laser medium part 30. As compared to the slab type laser apparatus of the first example according to the first embodiment as shown in FIG. 1, the configurations of the slab type $CO_2$ laser medium part 30 and the amplifier part 20 are identical, and only the configuration of the oscillator part 10 is different.

In the slab type laser apparatus of this example, the oscillator part 10 includes a part of the $CO_2$ laser medium part 30, and is provided with a pair of resonator mirrors 11 and 12, an electro-optic (EO) Pockels cell 13 and a polarizer 14. A coupling mirror is not used.

In the oscillator part 10, S-polarized light component in a $CO_2$ laser beam generated in the oscillator part 10 is reflected by the polarizer 14, and resonates between the resonator mirrors 11 and 12 and is grown. At suitable intervals, driving the EO Pockels cell 13 to make a phase shift corresponding to λ/4, the $CO_2$ laser beam being resonated is converted to P-polarized, and then the $CO_2$ laser beam passes through the polarizer 14 so as to enter the amplifier part 20.

The $CO_2$ laser beam having entered the amplifier part 20 is incident upon and reflected by an incidence mirror 21, passes through the amplification $CO_2$ laser medium part 30 and is amplified, and thereafter is multi-path-amplified between return mirrors 22 and 23 that are disposed substantially in parallel, and then outputted. In the slab type laser apparatus of this example, the coupling mirror 15 is not used at the amplifier part 10, and thus the optical system is simplified.

SECOND EXAMPLE

Figure 22:
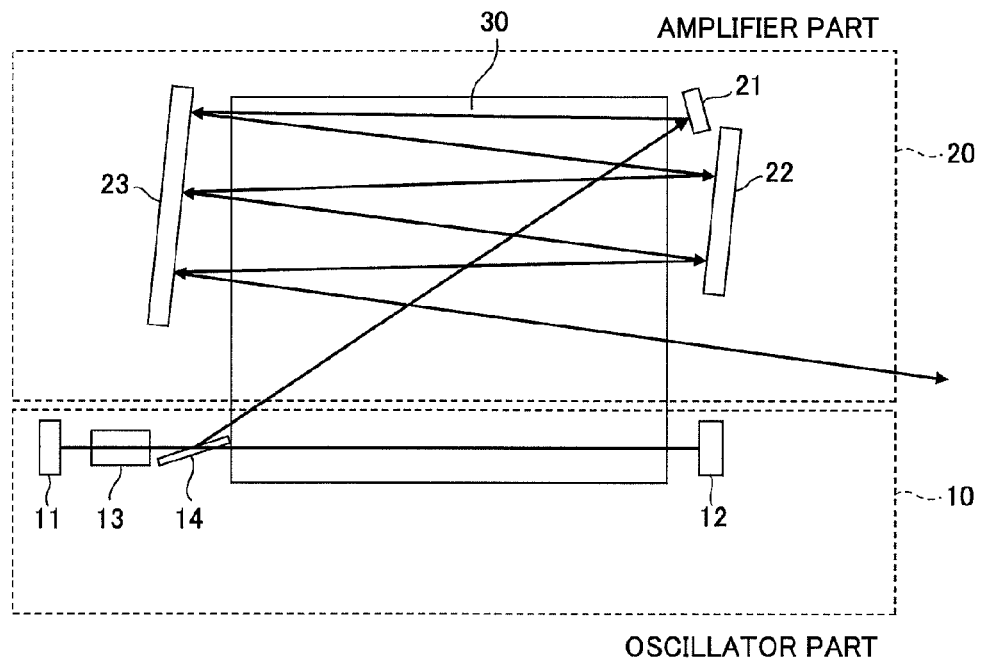
FIG. 22 is a schematic diagram showing a configuration of a slab type laser apparatus of a second example according to the fourth embodiment of the present invention.

FIG. 22 is a schematic diagram showing an exemplified configuration of a slab type laser apparatus of a second example according to the fourth embodiment of the present invention. An oscillator part 10 of the slab type laser apparatus of this example includes a part of a $CO_2$ laser medium part 30, and is provided with a pair of resonator mirrors 11 and 12, an electro-optic (EO) Pockels cell 13 and a polarizer 14, the same as the first example.

However, the oscillator part 10, different from the first example, resonates P-polarized light component that passes through the polarizer 14 between the resonator mirrors 11 and 12, among polarized light components of the $CO_2$ laser beam generated in the oscillator part 10. The laser beam is resonated on an optical path of substantially straight line between a pair of the resonator mirrors 11 and 12 that are opposed in parallel. Further, when the EO Pockels cell 13 is driven to make a phase shift corresponding to $\lambda/4$, the $CO_2$ laser beam is converted from the P-polarized light to the S-polarized light, and the $CO_2$ laser beam is reflected by the polarizer 14 and enters the amplifier part 20.

In the configuration as shown in FIG. 22, an incidence mirror 21 functions to guide the incident $CO_2$ laser beam so as to be multi-path-reflected between return mirrors 22 and 23 that are disposed substantially in parallel. The incidence mirror 21 is disposed substantially in a diagonal position with respect to the polarizer 14 sandwiching the $CO_2$ laser medium part 30. Thus, the $CO_2$ laser beam switched to the traveling direction by the polarizer 14 and traveling in the $CO_2$ laser medium part 30, undergoes the effect of amplification additionally until it reaches the incidence mirror 21, then enters between the return mirrors 22 and 23 that are disposed substantially in parallel, is multi-path-amplified and is outputted, so that the efficiency of amplification is more improved.

In addition, a coupling mirror is not used in the oscillator part 10, so that the optical system is simplified.

THIRD EXAMPLE

Figure 23:
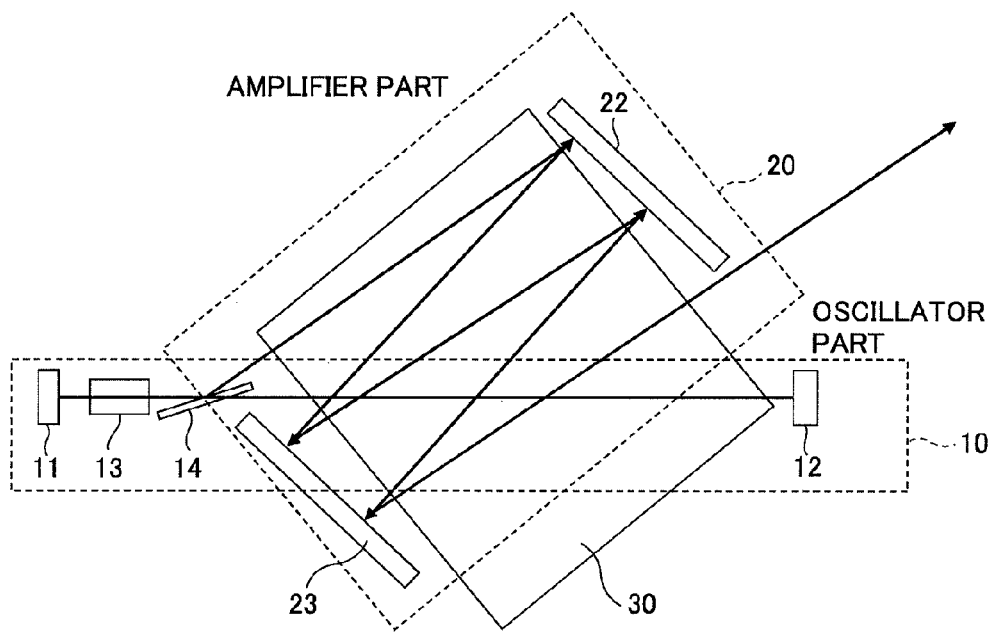
FIG. 23 is a schematic diagram showing a configuration of a slab type laser apparatus of a third example according to the fourth embodiment of the present invention.

FIG. 23 is a schematic diagram showing an exemplified configuration of a slab type laser apparatus of a third example according to the fourth embodiment of the present invention. An oscillator part 10 of the slab type laser apparatus of this example includes a part of a $CO_2$ laser medium part 30, is provided with a pair of resonator mirrors 11 and 12, an electro-optic (EO) Pockels cell 13 and a polarizer 14, and uses the resonance of P-polarized light component, the same as the second example. However, the oscillator part 10 and an amplifier part 20 are disposed so as to cross each other, and the two parts share a part of the $CO_2$ laser medium part 30. In a desired timing, a voltage is applied to the EO Pockels cell 13 and a phase shift corresponding to $\lambda/4$ is made, whereby a laser beam that goes and returns in this EO Pockels cell 13 is converted to S-polarized light from P-polarized light. By switching the $CO_2$ laser beam being resonated in the P-polarized light state to that in the S-polarized light state, the laser beam is highly reflected by the polarizer 14 and enters the amplifier part 20 as it is. Therefore, it is unnecessary to dispose not only a coupling mirror 15 but also an incidence mirror 21.

Embodiment 5

Figure 24:
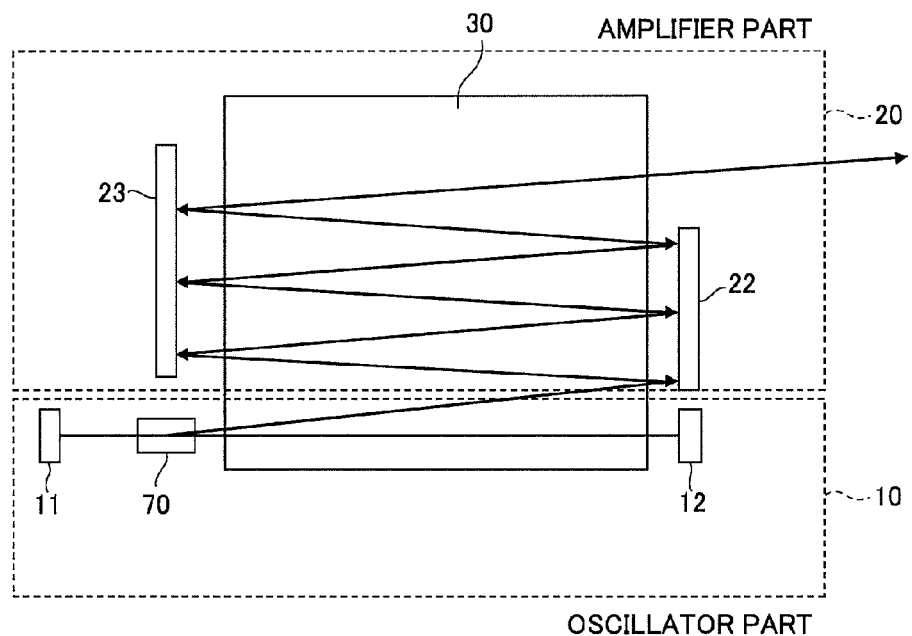
FIG. 24 is a schematic diagram showing a configuration of a slab type laser apparatus according to a fifth embodiment of the present invention.

FIG. 24 is a drawing showing a slab type laser apparatus according to a fifth embodiment of the present invention. The slab type laser apparatus according to this embodiment has a configuration including a photoacoustic element 70 instead of an EO Pockels cell and a polarizer in an oscillator part 10, no coupling mirror similarly to the slab type laser apparatus according to the fourth embodiment, and further no incidence mirror in the amplifier part 20.

In the slab type laser apparatus according to this embodiment, when the photoacoustic element 70 is operated in a predetermined timing during the laser beam is resonating between resonator mirrors 11 and 12, the laser beam is outputted in a direction different from the optical axis between the resonator mirrors, and enters the amplifier part 20 from the side close to the oscillator part 10. The incident laser beam is multi-path-amplified between return mirrors 22 and 23 that are disposed substantially in parallel and sandwiching the $CO_2$ laser medium part 30, and then outputted from a remote portion of the amplifier part 20 remote from the oscillator part 10.

Embodiment 6

Figure 25:
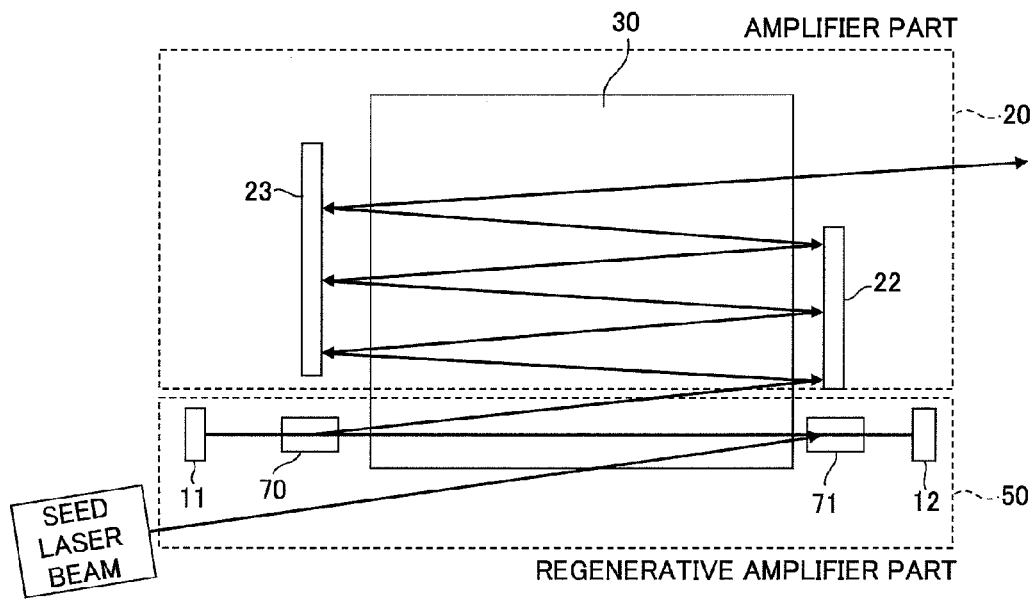
FIG. 25 is a schematic diagram showing a configuration of a slab type laser apparatus according to a sixth embodiment of the present invention.

FIG. 25 is a drawing showing a slab type laser apparatus according to a sixth embodiment of the present invention. The slab type laser apparatus according to this embodiment is provided with a regenerative amplifier part 50, instead of the oscillator part 10 of the slab type laser apparatus according to the fifth embodiment, which is provided with a second photoacoustic element 71 in an optical axis of resonance between resonator mirrors 11 and 12, and amplifies a seed laser beam introduced by the second photoacoustic element.

In this embodiment, when the second photoacoustic element 71 in the regenerative amplifier 50 is turned to ON, a pulsed seed laser beam is introduced in a resonator formed of the resonator mirrors 11 and 12. Thereafter, when the second photoacoustic element 71 is turned to OFF, the seed laser beam is turned by the resonator mirror 12, passes with maintaining passing direction through the second photoacoustic element 71 which has been turned to OFF, passes through a $CO_2$ laser medium part 30 and is amplified, then passes through the first photoacoustic element 70 which has been turned to OFF, is turned by the resonator mirror 11, passes with maintaining passing direction through the first photoacoustic element 70 which has been turned to OFF, and enters the $CO_2$ laser medium part 30 and is amplified again.

By the repetition thereof, the seed laser beam is regenerated and amplified. At a point of time when a desired energy is obtained, the first photoacoustic element 70 is operated, and the laser beam regenerated and amplified is outputted to an amplifier part 20. The laser beam outputted from this regenerative amplifier 50 passes through the $CO_2$ laser medium part 30 and is amplified, and is incident upon and reflected by a high-reflectance mirror 22. Further, the laser beam passes through the $CO_2$ laser medium part 30 and is amplified, is multi-path-amplified between a high-reflectance mirror 23 and the high-reflectance mirror 22, and is outputted from the amplifier part 20.

Embodiment 7

Figure 26:
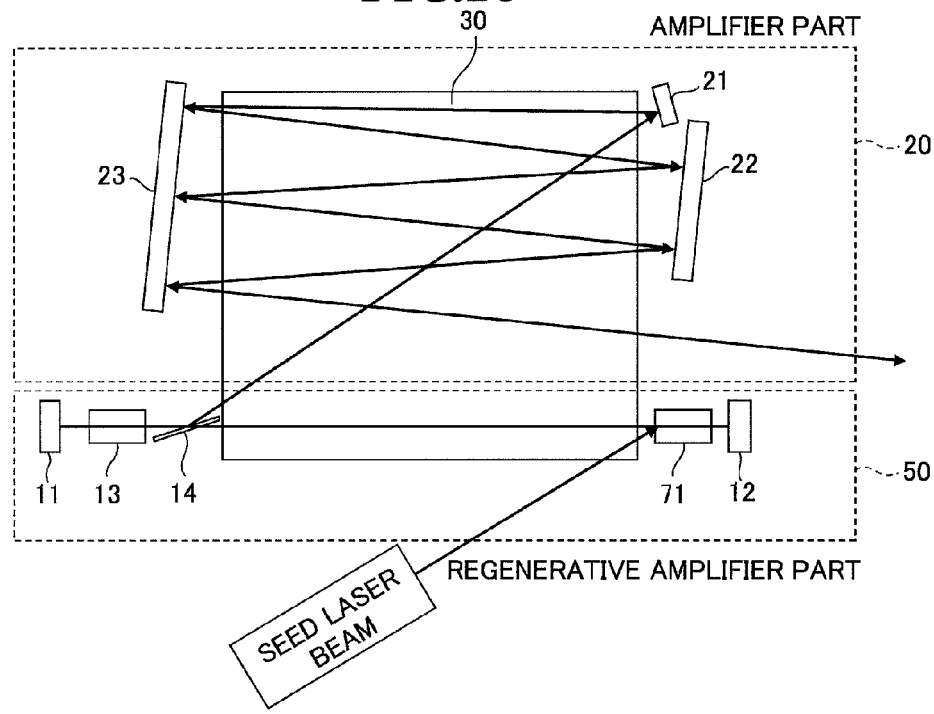
FIG. 26 is a schematic diagram showing a configuration of a slab type laser apparatus of a first example according to a seventh embodiment of the present invention.
Figure 27:
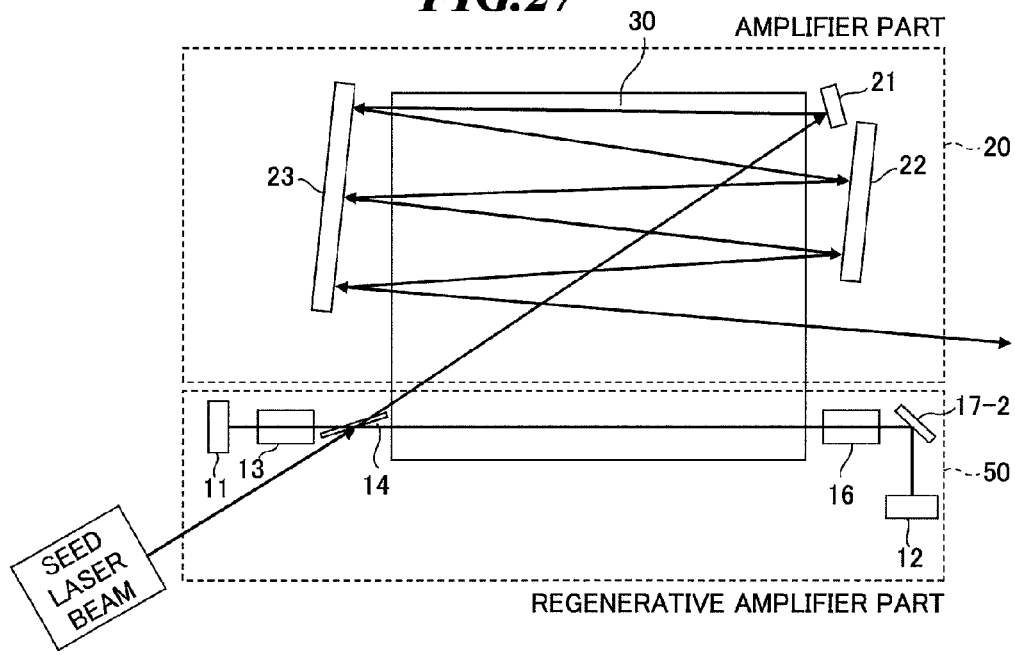
FIG. 27 is a schematic diagram showing a configuration of a slab type laser apparatus of a second example according to the seventh embodiment of the present invention.

FIGS. 26 and 27 show slab type laser apparatuses according to a seventh embodiment of the present invention. The slab type laser apparatus according to this embodiment is provided with a regenerative amplifier part in which a seed laser beam is introduced to be regenerated and amplified, instead of the oscillator part in the slab type laser apparatus according to the fourth embodiment as shown in FIG. 22, for example.

FIRST EXAMPLE

FIG. 26 is a schematic diagram showing an exemplified configuration of a slab type laser apparatus of a first example according to the seventh embodiment. The slab type laser apparatus of this example is provided with an EO Pockels cell 13, a polarizer 14 and a photoacoustic element 71 between resonator mirrors 11 and 12 in a regenerative amplifier part 50, and is introduced with a seed laser beam to be regenerated and amplified by the photoacoustic element 71, and supplies the amplified laser beam to an amplifier part 20.

In the slab type laser apparatus of this example, when the photoacoustic element 71 of the regenerative amplifier part 50 is turned to ON, a pulsed seed laser beam of P-polarized light is introduced into the resonator that is formed of the resonator mirrors 11 and 12. Thereafter, when the photoacoustic element 71 is turned to OFF, the seed laser beam is turned at the resonator mirror 12, passes with maintaining passing direction through the photoacoustic element 71 which has been turned to OFF, passes through a $CO_2$ laser medium part 30 and is amplified, then passes through the polarizer 14 in the state of the P-polarized light, passes through the EO Pockels cell 13 which has been turned to OFF, is turned at the resonator mirror 11, passes with maintaining passing direction through the EO Pockels cell 13, passes through the polarizer 14 in the state of the P-polarized light, and enters and passes through the $CO_2$ laser medium part 30 and is amplified again. By the repetition thereof, the seed laser beam is regenerated and amplified.

At a point of time when a desired energy is obtained, when the EO Pockels cell 13 is operated, the seed laser beam is converted to the S-polarized light, highly reflected by the polarizer 14, regenerated and amplified, and outputted to an amplifier part 20. The laser beam outputted from this regenerative amplifier part 50 to the amplifier part 20 passes through the $CO_2$ laser medium part 30 and is amplified, and is incident upon and reflected by a high-reflectance mirror 21. Further, the laser beam passes through the $CO_2$ laser medium part 30 and is amplified, is multi-path-amplified between a high-reflectance mirror 23 and a high-reflectance mirror 22, and is outputted from the amplifier part 20.

SECOND EXAMPLE

FIG. 27 is a schematic diagram showing an exemplified configuration of a slab type laser apparatus of a second example according to the seventh embodiment of the present invention. The slab type laser apparatus of this example is provided with a first EO Pockels cell 13, a polarizer 14, a second EO Pockels cell 16, and a high-reflectance film mirror 17-2 acting as an element of making a phase shift corresponding to $\lambda/4$, between resonator mirrors 11 and 12 in a regenerative amplifier part 50. The polarizer 14 introduces a seed laser beam of S-polarized light between the resonator mirrors 11 and 12, which regenerates and amplifies the seed laser beam to supply the seed laser beam to the amplifier part 20. It is unnecessary to provide a coupling mirror between the regenerative amplifier part 50 and the amplifier part 20.

In the slab type laser apparatus of this example, a pulsed seed laser beam of S-polarized light is incident upon and reflected by a polarized film plane of the polarizer 14, and is introduced into a resonator formed between the resonator mirrors 11 and 12. The seed laser beam introduced in the resonator passes through a $CO_2$ laser medium part 30 and is amplified, passes through the second EO Pockels cell 16 while maintaining passing direction, is reflected by the high-reflectance film mirror 17-2 coated with a high-reflectance film for making a phase shift corresponding to $\lambda/4$ and is thereby converted to circularly polarized light, is reflected by the resonator mirror 12, and is reflected by the high-reflectance film mirror 17-2 for making a phase shift corresponding to $\lambda/4$ again and is thereby converted to P-polarized light. Then, the seed laser beam passes through the second EO Pockels cell 16 while maintaining passing direction, passes through the $CO_2$ laser medium part 30 and is amplified, and passes through the polarizer 14. Then, the seed laser beam passes through the first EO Pockels cell 13, is turned by the resonator mirror 11, and passes through the first EO Pockels cell 13 and the polarizer 14 in the state of P-polarized light.

The seed laser beam further passes through the $CO_2$ laser medium part 30 and is amplified in the state of P-polarized light, thereafter is converted to circularly polarized light with a phase shift corresponding to $\lambda/4$ made by the operation of the second EO Pockels cell 16, and is converted to S-polarized light by being reflected by the high-reflectance film mirror 17-2 which makes a phase shift corresponding to $\lambda/4$. This S-polarized light is reflected by the resonator mirror 12, converted to circularly polarized light by the high-reflectance film mirror 17-2 which makes a phase shift corresponding to $\lambda/4$, and further converted to P-polarized light with a phase shift corresponding to $\lambda/4$ made by the second EO Pockels cell 16. Further, this P-polarized light passes through the $CO_2$ laser medium part 30 and is amplified, and passes through the polarizer 14. Then, this P-polarized light passes through the first EO Pockels cell 13, is reflected by the resonator mirror 11, passes through the first EO Pockels cell 13 and the polarizer 14 in the state of P-polarized light, and enters the $CO_2$ laser medium part 30 again. Further, these operations are repeated.

Furthermore, at a point of time when the seed laser beam regenerated and amplified by resonance between the resonator mirrors 11 and 12 comes to have the desired energy, the first EO Pockels cell 13 is operated, thereby the P-polarized light is converted to circularly polarized light, then is highly reflected by the resonator mirror 11, converted to the S-polarized light by the first EO Pockels cell and highly reflected by the polarizer 14, and thus a laser beam is outputted that is formed from the seed laser beam by regenerating and amplifying. The laser beam outputted from the regenerative amplifier passes through the $CO_2$ laser medium part 30 and is amplified, and is incident upon and reflected by a high-reflectance mirror 21. Further, the laser beam is amplified in the $CO_2$ laser medium part 30 during go and return movement between mirrors 23 and 22, and outputted.

Figure 28:
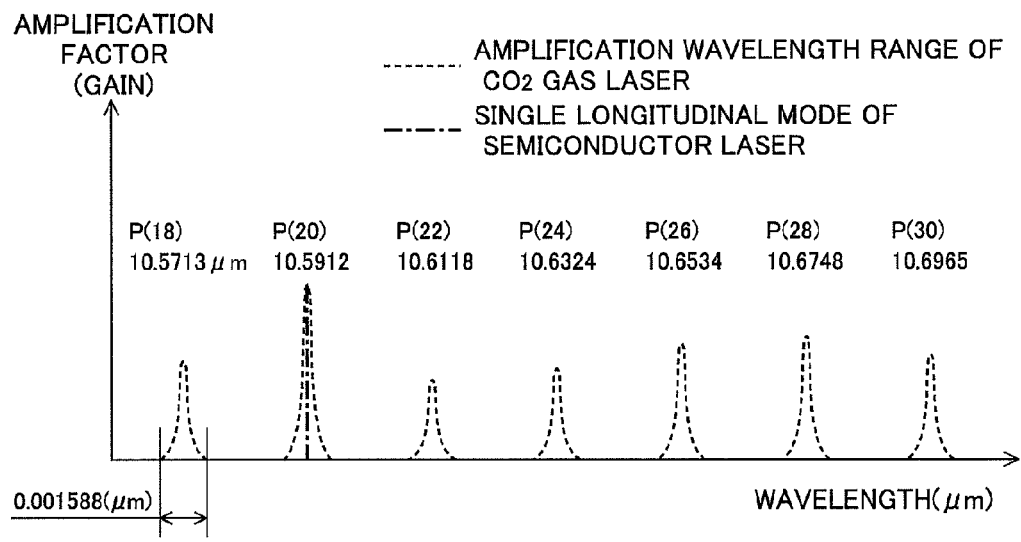
FIG. 28 is a schematic chart showing a gain range of a carbon dioxide gas laser in a slab type laser apparatus according to the respective embodiments of the present invention.

FIG. 28 is a schematic chart schematically showing the relationship between a gain range and a wavelength of each line of a $CO_2$ laser in the case where a longitudinal mode of a semiconductor laser generating a seed laser beam is single mode. In the graph of FIG. 28, a wavelength is schematically plotted on the axis of abscissas, and an amplification gain is schematically plotted on the axis of ordinates. Dotted lines indicate amplification wavelength ranges of P(18), P(20), P(22), P(24), P(26), P(28) and P(30), and there exist gain ranges of a predetermined wavelength width with respect to each of these lines. This gain wavelength width $\Delta v$ is generated by a pressure broadening of a rotation gain bandwidth, and it is obtainable by the following equation: START $$\Delta \nu = 7.58(\Phi CO_2 + 0.73\Phi N_2 + 0.64\Phi He) \times P(300/T)^{1/2} \quad (17)$$

where: Φ denotes partial pressure, P denotes pressure (torr), and T denotes temperature (K). On typical conditions that $CO_2:N_2:He=1:1:8$, pressure is 100 torr, and temperature is 450K, the gain width Δν of each line is 424 MHz, that is, the wavelength width becomes about 0.001588 μm.

Therefore, in the case of a single longitudinal mode oscillation, amplification can be made in case where the oscillation wavelength of a semiconductor laser is stabilized in the range of 10.5912±0.000794 μm, for example, so that the oscillation wavelength is to be in the range within the gain width of about 0.001588 μm with respect to the $CO_2$ laser amplification line P (20) of 10.5912 μm. However, the oscillation wavelength of the semiconductor laser needs to be stabilized in the vicinity of the peak of an amplification gain in order to keep output power of the laser stable. Incidentally, the oscillation wavelength of the semiconductor laser is not limited to this amplification line P (20), but amplification can be made by stabilizing the oscillation wavelength in the range of ±0.000794 μm centered with the wavelength of each amplification line. However, so as to keep stable output power of the laser, it is necessary to stabilize the oscillation wavelength of each semiconductor laser in the vicinity of the peak of each amplification gain.

Figure 29:
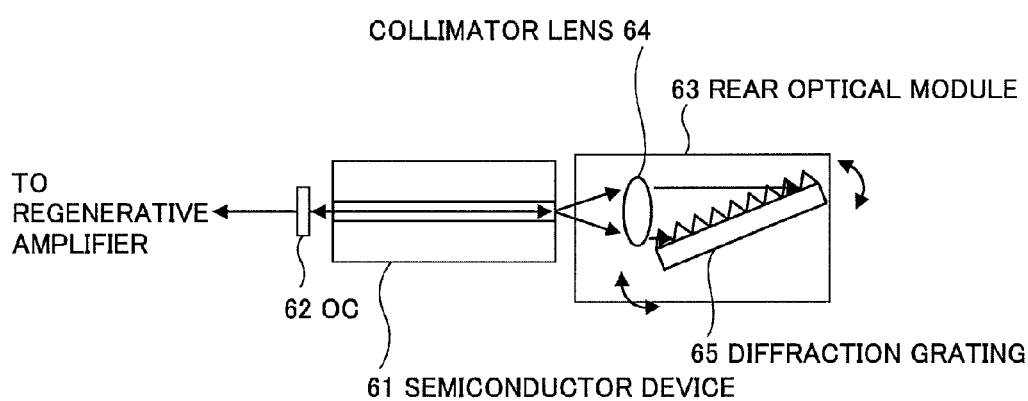
FIG. 29 is a schematic diagram showing a configuration of a semiconductor laser apparatus to be used as a seeder of a slab type laser apparatus according to the respective embodiments of the present invention.

FIG. 29 is a schematic diagram showing an example of a resonator in the case where a semiconductor laser of single longitudinal mode is used as the seed laser. An output coupling mirror (output coupler: OC) 62 is disposed on the front side of a semiconductor device 61, and a rear optical module 63 is disposed on the rear side. The OC 62 and the rear optical module 63 form an optical resonator. The OC 62 is a mirror applied with a partial reflection mirror coat, and outputs a part of a laser beam and whereas returns a part of the laser beam into the resonator so as to be resonated. In the rear optical module 63, there are disposed a collimator lens 64 and a diffraction grating 65. The diffraction grating 65 is Littrow-arranged so that the incident angle and the diffraction angle are the same. By changing this incident and diffraction angle, the wavelength to be selected can be controlled.

With the arrangement, by selecting only one light component from the light components of multi longitudinal mode using the diffraction grating 65 to return it to the resonator, single longitudinal mode oscillation can be made. Further, with the use of a mechanism of rotating this diffraction grating 65 to make wavelength selection, and a mechanism of controlling and stabilizing a resonator length, not shown, the wavelength of single longitudinal mode is fixed to be P(20) of 10.5912 μm, and whereby pulse amplification using a $CO_2$ gas laser amplifier can be made.

In this embodiment, although the wavelength of a semiconductor laser is coincident with P (20), it is not limited to this example, but the wavelength has only to be coincident with the gain range of each amplification line. In addition, although Littrow-arrangement of a diffraction grating is shown as an example of single longitudinal mode of this semiconductor laser, it is not limited to this example, but various wavelength selection techniques, for example, etalon can be employed by which single longitudinal mode can be selected. Furthermore, although in this embodiment, shown is an example of a semiconductor laser of making single longitudinal mode oscillation using an external resonator, it is not limited to this example, but it is preferable to use a semiconductor laser of distributed feedback type in which a wavelength selection element such as a diffraction grating is integrated into a semiconductor device. Further, a quantum cascade laser may be used for the seed laser oscillator in the invention.

Figure 30:
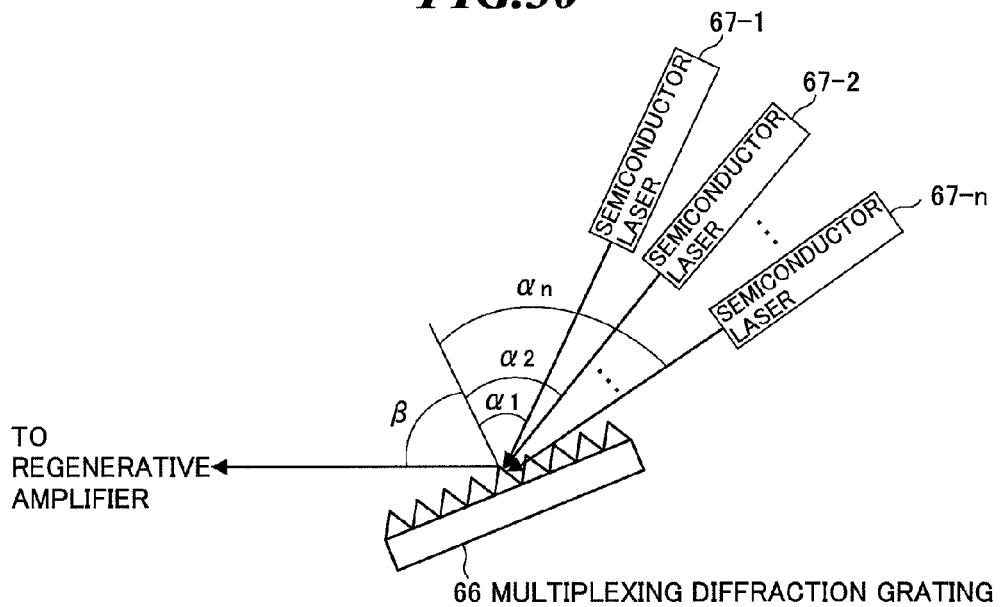
FIG. 30 is a schematic diagram showing a configuration of another semiconductor laser apparatus to be used as a seeder of a slab type laser apparatus according to the respective embodiments of the present invention.
Figure 31:
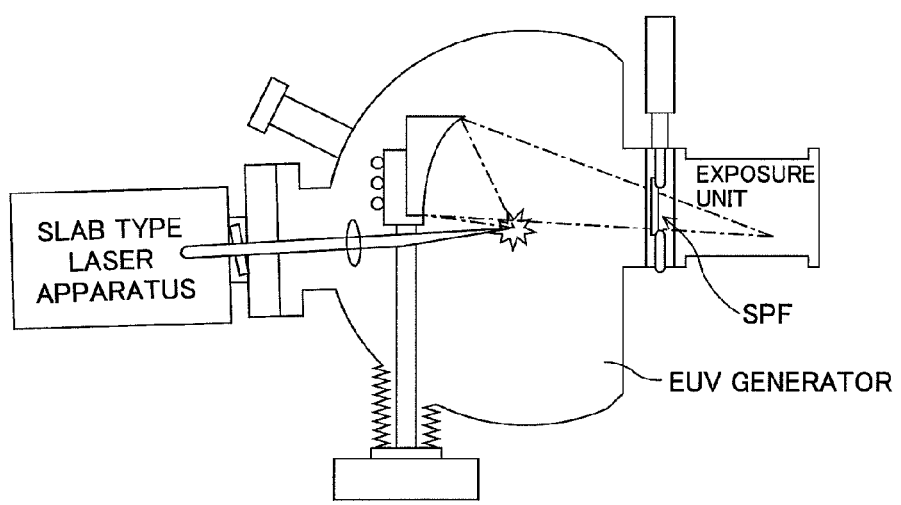
FIG. 31 is a schematic diagram of an extreme ultraviolet light source apparatus to which a slab type laser apparatus according to the respective embodiments of the present invention is applied.
Figure 32:
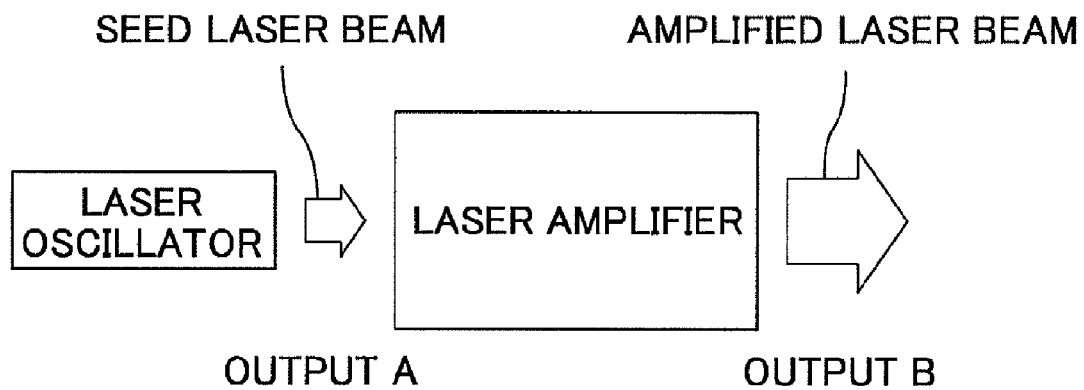
FIG. 32 is a block diagram of a master oscillator power amplifier type laser apparatus of prior art.

FIG. 30 is a schematic diagram showing an exemplified configuration of a semiconductor laser to be used as a seed laser in a slab type laser apparatus according to the respective embodiments of the present invention. What is different from the example of FIG. 29 is that using a plurality of semiconductor lasers of single longitudinal mode, and output beams are multiplexed in order to form a multi-line seeder and injected into a resonator of a regenerative amplifier part according to the present invention. A multiplexing diffraction grating is used as an optical element functioning as a multiplexing part.

In spectral analysis at the diffraction grating, the following equation holds between the angle of incidence a and the angle of diffraction β.

$$m\lambda = a(\sin\alpha \pm \sin\beta) \quad (18)$$

where: m denotes a spectral order, λ denotes wavelength, and "a" denotes distance between grids. Therefore, multiplexing can be made, by setting the angles of incidence α1, α2, . . . αn and the angle of diffraction β with which the following equations hold.

$$m\lambda 1 = a(\sin\alpha 1 \pm \sin\beta) \quad (19)$$

$$m\lambda 2 = a(\sin\alpha 2 \pm \sin\beta) \quad (20)$$

$$\vdots$$

$$m\lambda n = a(\sin\alpha n \pm \sin\beta) \quad (21)$$

where the oscillation wavelength λ1, λ2, . . . λn of a semiconductor laser may be any one of the wavelengths of amplification lines of a $CO_2$ laser as shown in FIG. 28.

In FIG. 30, each of a plurality of semiconductor lasers 67-1 to 67-n (67) has a single longitudinal mode, and oscillates light having a wavelength in the amplification wavelength range of a regenerative amplifier part and an amplifier part. Respective beams of the semiconductor lasers 67-1 to 67-n (67) are inputted to the multiplexing diffraction grating 66 at the angles of incidence α1, α2, . . . αn. Further, respective beams of the semiconductor lasers are outputted from multiplexing diffraction grating 66 at the same angle of diffraction β to be multiplexed. An example of a multiplexing part is not limited to this embodiment, but it may have only a function to multiplex a plurality of single longitudinal mode semiconductor laser beams into the same optical axis.

Each semiconductor laser 67 is substantially matched to have a wavelength in the amplification wavelength range of a regenerative amplifier part and an amplifier part, but the wavelength is varied by change of the refractive index due to temperature variation and so on. Thus, each wavelength are controlled by compensation of the temperature, or by adjustment of the resonator length and the selected wavelength of the diffraction grating via a longitudinal mode controller, not shown, which is mounted on each of the semiconductor lasers 67-1 through 67-n.

The invention claimed is:

1. A slab type laser apparatus including a slab type gas laser medium part formed in a region defined by a pair of electrode flat plates oppositely disposed in parallel with each other in a space to be filled with a gas laser medium, said gas laser medium being excited when high-frequency electric power is applied to said pair of electrode flat plates in the space filled with the gas laser medium, said apparatus comprising:

an oscillator part including a pair of resonator mirrors oppositely disposed with a part of said slab type gas laser medium part in between, and a coupling unit, said oscillator part amplifying a laser beam oscillated in said oscillator part to have predetermined light intensity, and thereafter driving said coupling unit to emit the laser beam; and an amplifier part including an incidence mirror for deflecting the laser beam emitted from said oscillator part, and a plurality of return mirrors oppositely disposed with a part of said slab type gas laser medium part in between, said amplifier part configured such that a laser beam goes and returns plural times between said plurality of return mirrors, and said amplifier part receiving the laser beam emitted from said oscillator part, and amplifying the laser beam to an amplified laser beam having predetermined power to output the amplified laser beam.

2. The slab type laser apparatus according to claim 1, wherein said coupling unit includes a Pockels cell, a polarizer, and a coupling mirror, and said Pockels cell converts the laser beam into S-polarized light such that the laser beam is reflected at a surface of the polarizer and incident upon the coupling mirror, and reflected by the coupling mirror and incident upon said amplifier part.

3. The slab type laser apparatus according to claim 1, wherein said laser medium includes a $CO_2$ laser medium containing carbon dioxide gas ($CO_2$).

4. The slab type laser apparatus according to claim 1, wherein said plurality of return mirrors include any one of a combination of plane mirrors, a combination of a plane mirror and a concave mirror, a combination of concave mirrors, and a combination of a concave mirror and a convex mirror.

5. The slab type laser apparatus according to claim 1, further comprising:
 a saturable absorber disposed between said plurality of return mirrors in said amplifier part.

6. A slab type laser apparatus including a slab type gas laser medium part formed in a region defined by a pair of electrode flat plates oppositely disposed in parallel with each other in a space to be filled with a gas laser medium, said gas laser medium being excited when high-frequency electric power is applied to said pair of electrode flat plates in the space filled with the gas laser medium, said apparatus comprising:

a regenerative amplifier part including a pair of resonator mirrors oppositely disposed with a part of said slab type gas laser medium part in between, a $\lambda/4$ wavelength plate, and a coupling unit, said regenerative amplifier part receiving a seed laser beam emitted from a seed laser generator, resonating the seed laser beam between said pair of resonator mirrors to amplify the seed laser beam to have predetermined light intensity, and thereafter driving said coupling unit to emit the amplified laser beam; and an amplifier part including an incidence mirror for deflecting the laser beam emitted from said regenerative amplifier part, and a plurality of return mirrors oppositely disposed with a part of said slab type gas laser medium part in between, said amplifier part configured such that a laser beam goes and returns plural times between said plurality of return mirrors, and said amplifier part receiving the laser beam emitted from said regenerative amplifier part, and amplifying the laser beam to an amplified laser beam having predetermined power to output the amplified laser beam.

7. The slab type laser apparatus according to claim 6, wherein said coupling unit includes a first Pockels cell, a polarizer, and a second Pockels cell, and switching is made between regenerative amplification of the seed laser beam in said regenerative amplifier part and output of the laser beam to said amplifier part by adjusting voltages to be applied to the first Pockels cell and the second Pockels cell.

8. The slab type laser apparatus according to claim 6, wherein said seed laser generator includes any of a single-line seeder and a multi-line seeder.

9. The slab type laser apparatus according to claim 6, wherein said laser medium includes a $CO_2$ laser medium containing carbon dioxide gas ($CO_2$).

10. The slab type laser apparatus according to claim 6, wherein said plurality of return mirrors include any one of a combination of plane mirrors, a combination of a plane mirror and a concave mirror, a combination of concave mirrors, and a combination of a concave mirror and a convex mirror.

11. The slab type laser apparatus according to claim 6, further comprising:
 a saturable absorber disposed between said plurality of return mirrors in said amplifier part.

* * * * *